(12) United States Patent
Bu

(10) Patent No.: US 10,283,460 B2
(45) Date of Patent: May 7, 2019

(54) SEMICONDUCTOR DEVICE, MANUFACTURING METHOD THEREOF, AND ELECTRIC POWER CONVERSION DEVICE

(71) Applicant: HITACHI, LTD., Tokyo (JP)

(72) Inventor: Yuan Bu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/815,872

(22) Filed: Nov. 17, 2017

(65) Prior Publication Data
US 2018/0151514 A1 May 31, 2018

(30) Foreign Application Priority Data

Nov. 29, 2016 (JP) ................................. 2016-231602

(51) Int. Cl.
*H01L 29/861* (2006.01)
*H01L 29/36* (2006.01)
(Continued)

(52) U.S. Cl.
CPC ...... *H01L 23/585* (2013.01); *H01L 21/02019* (2013.01); *H01L 21/02035* (2013.01);
(Continued)

(58) Field of Classification Search
CPC ............. H01L 29/0615; H01L 29/0619; H01L 29/6606; H01L 29/8613; H01L 29/36; H01L 29/1608
See application file for complete search history.

(56) References Cited

U.S. PATENT DOCUMENTS 5,967,795 A * 10/1999 Bakowsky .......... H01L 29/0615
257/E29.012
6,844,251 B2 * 1/2005 Shenai ................ H01L 29/6606
257/E21.067
(Continued)

FOREIGN PATENT DOCUMENTS

EP 1973164 * 9/2008 ........... H01L 29/861
EP 1973165 A1 9/2008
(Continued)

OTHER PUBLICATIONS

Extended European Search Report dated Apr. 25, 2018 for the European Application No. 17001863.4.
(Continued)

*Primary Examiner* — Victoria K. Hall
(74) *Attorney, Agent, or Firm* — Volpe and Koenig, P.C.

(57) ABSTRACT

A technology is proposed in which the improvement of the capability of a semiconductor device can be realized by satisfying both reduction of leakage currents and suppression of the degradation of the conductive characteristic of the semiconductor device. An electric field relaxation region ERR is formed in an outer edge region on the outside of a mesa structure MS. In addition, an electric charge implantation region EIR formed on a drift layer EPI, a resistance reduction region RR formed on the electric charge implantation region EIR, and a leakage reduction region LR formed at a sidewall portion of the mesa structure MS are formed in the mesa structure MS. In this case, the impurity concentration of the leakage reduction region LR is set larger than the impurity concentration of the electric field relaxation region ERR, and is set smaller than the impurity concentration of the resistance reduction region RR.

10 Claims, 17 Drawing Sheets

(51) Int. Cl.
  *H01L 29/16* (2006.01)
  *H01L 29/06* (2006.01)
  *H01L 21/329* (2006.01)
  *H01L 23/58* (2006.01)
  *H01L 21/02* (2006.01)
  *H01L 23/522* (2006.01)
  *H01L 29/66* (2006.01)

(52) U.S. Cl.
  CPC .... *H01L 21/02167* (2013.01); *H01L 23/5228* (2013.01); *H01L 29/0615* (2013.01); *H01L 29/0619* (2013.01); *H01L 29/1608* (2013.01); *H01L 29/36* (2013.01); *H01L 29/6606* (2013.01); *H01L 29/8613* (2013.01)

(56) References Cited

U.S. PATENT DOCUMENTS

| | | | | |
|---|---|---|---|---|
| 7,372,087 | B2* | 5/2008 | Chen | H01L 29/0619 257/263 |
| 8,178,949 | B2 | 5/2012 | Ishii et al. | |
| 8,896,084 | B2* | 11/2014 | Sugawara | H01L 29/0615 257/471 |
| 9,224,877 | B2 | 12/2015 | Hiyoshi et al. | |
| 10,008,592 | B1* | 6/2018 | Kojima | H01L 29/0615 |
| 10,134,920 | B2* | 11/2018 | Kawahara | H01L 29/06 |
| 2003/0045035 | A1* | 3/2003 | Shenai | H01L 29/6606 438/142 |
| 2005/0285228 | A1 | 12/2005 | Sugawara | |
| 2006/0214268 | A1* | 9/2006 | Maeyama | H01L 29/045 257/628 |
| 2007/0200115 | A1* | 8/2007 | Das | H01L 29/1608 257/77 |
| 2009/0195296 | A1* | 8/2009 | Miyanagi | H01L 23/345 327/530 |
| 2010/0032686 | A1* | 2/2010 | Ishii | H01L 29/1608 257/77 |
| 2010/0084663 | A1* | 4/2010 | Ishii | H01L 29/66106 257/77 |
| 2012/0228734 | A1* | 9/2012 | Kamaga | H01L 29/0615 257/487 |
| 2013/0063067 | A1* | 3/2013 | Tanaka | H01L 25/07 318/494 |
| 2013/0065382 | A1* | 3/2013 | Nishio | H01L 29/872 438/522 |
| 2015/0115283 | A1* | 4/2015 | Domeij | H01L 29/32 257/77 |
| 2015/0115284 | A1 | 4/2015 | Arthur et al. | |
| 2017/0207301 | A1* | 7/2017 | Harada | H01L 29/78 |
| 2017/0213908 | A1* | 7/2017 | Fursin | H01L 29/66325 |
| 2018/0033885 | A1* | 2/2018 | Okumura | H01L 21/02378 |
| 2018/0040688 | A1* | 2/2018 | Kobayashi | H01L 29/0623 |
| 2018/0076290 | A1* | 3/2018 | Takayanagi | H01L 29/1608 |
| 2018/0138288 | A1* | 5/2018 | Utsumi | H01L 21/3065 |

FOREIGN PATENT DOCUMENTS

| | | | | |
|---|---|---|---|---|
| JP | 2008-211171 | A | 9/2008 | |
| JP | 2014-107499 | A | 6/2014 | |
| WO | 2007/100364 | A1 | 9/2007 | |
| WO | WO-2011105434 | A1 * | 9/2011 | ......... H01L 29/0615 |

OTHER PUBLICATIONS

Kimoto et al., "Ion Implantation Technology in SiC for Power Device Applications," 2014 International Workshop on Junction Technology (IWJT), Shanghai, pp. 1-6 (2014).

Kimoto, "Ultrahigh-Voltage SiC Devices for Future Power Infrastructure," 2013 Proceedings of the European Solid-State Device Research Conference (ESSDERC), Bucharest, pp. 22-29 (2013).

Hiyoshi et al., "Bevel Mesa Combined with Implanted Junction Termination Structure for 10 kV SiC PiN Diodes." Materials Science Forum, vols. 600-603. pp. 995-998 (Jan. 2009).

* cited by examiner

EIR : ELECTRIC CHARGE IMPLANTATION REGION
EPI : DRIFT LAYER
ERR : ELECTRIC FIELD RELAXATION REGION
LR : LEAKAGE REDUCTION REGION
MS : MESA STRUCTURE
RR : RESISTANCE REDUCTION REGION

SEMICONDUCTOR DEVICE, MANUFACTURING METHOD THEREOF, AND ELECTRIC POWER CONVERSION DEVICE

TECHNICAL FIELD

The present invention relates to effective technologies to be applied to a semiconductor device that uses silicon carbide (SiC), a manufacturing method thereof, and an electric power conversion device.

BACKGROUND ART

Japanese Unexamined Patent Application Publication No. 2014-107499 (Patent Literature 1) discloses a technology in which a JTE region is formed on a sidewall surface of the mesa structure.

Japanese Unexamined Patent Application Publication No. 2008-211171 (Patent Literature 2) discloses a technology in which an electric field relaxation structure is formed on a part of a sidewall surface of the mesa structure.

CITATION LIST

Patent Literature

Patent Literature 1: Japanese Unexamined Patent Application Publication No. 2014-107499
Patent Literature 2: Japanese Unexamined Patent Application Publication No. 2008-211171

SUMMARY OF INVENTION

Technical Problem

One of the most serious problems in realizing sustainable society is the depletion of energy resources and another is the excessive emission of greenhouse gases such as carbon dioxide. Therefore, it is becoming very important to develop electric power conversion devices that are energy-efficient and do not emit much carbon dioxide. Most of electric power conversion devices include power modules each of which includes an insulated gate bipolar transistor (IGBT) that is a switching element and a pin diode (PND) that is a rectifying element, where the IGBT and the PND are connected in parallel. Therefore, the reduction of losses of semiconductor devices is directly linked to the energy conservation of electric power conversion devices.

As a technology for decreasing the loss of a semiconductor device, a method in which semiconductor elements are formed using 4H type silicon carbide (4H—SiC is referred to as SiC hereinafter) has been attracting attention. However, as a result of an investigation by the present inventors, it has been revealed that, in order to satisfy both reduction of leakage currents of current semiconductor elements made of silicon carbide when backward voltages are applied to the semiconductor elements and suppression of the degradations of the conductive characteristics of the semiconductor elements when forward voltages are applied to the semiconductor elements, it is necessary to examine the improvement of the semiconductor elements.

The object of the present invention is to provide a technology that can improve the capabilities of semiconductor devices by satisfying both reduction of leakage currents and suppression of degradations of the conductive characteristics of the semiconductor devices.

Other problems and new features of the present invention will be revealed in accordance with the description of the present invention and with reference to the accompanying drawings hereinafter.

Solution to Problem

A semiconductor device according to one of the embodiments of the present invention includes: a silicon carbide substrate; a first conductivity type drift layer formed on the silicon carbide substrate; a mesa structure formed on a surface of the drift layer; and a second conductivity type electric field relaxation region the conductivity type of which is opposite to the first conductivity type and that is formed in an outer edge region on the outside of the mesa structure on a surface region of the drift layer. In this case, in the mesa structure, there are formed: an electric charge implantation region of the second conductivity type formed on the drift layer; a resistance reduction region of the second conductivity type formed on the electric charge implantation region; a leakage reduction region of the second conductivity type that is formed at a sidewall portion of the mesa structure and adjacent to the resistance reduction region, the electric charge implantation region, and the electric field relaxation region. Furthermore, the impurity concentration of the leakage reduction region is larger than the impurity concentration of the electric field relaxation region and smaller than the impurity concentration of the resistance reduction region.

Advantageous Effects of Invention

According to one of the embodiments, both reduction of leakage currents and suppression of degradation of the conductive characteristic of a semiconductor device can be satisfied at the same time. Therefore, the improvement of the capability of the semiconductor device can be realized according to this embodiment.

DESCRIPTION OF EMBODIMENTS

First Embodiment

Configuration Example of Three-Phase Motor System

Figure 1:
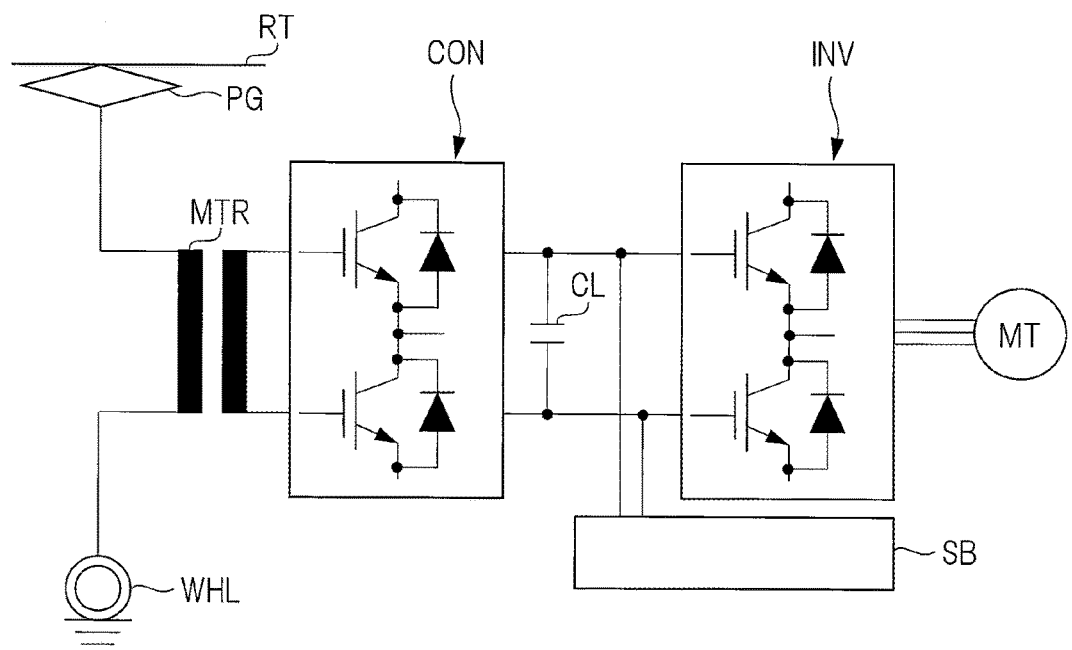
FIG. 1 is a block diagram showing an example of a three-phase motor system applicable to a railway vehicle.

FIG. 1 is a block diagram showing an example of a three-phase motor system (electric power conversion device) applicable to, for example, a railway vehicle. As shown in FIG. 1, electric power is supplied to a railway vehicle from an overhead wire RT via a pantograph PG. In this case, a high AC voltage supplied from the overhead wire RT is, for example, 25 kV or 15 kV. The high AC voltage supplied to the railway vehicle from the overhead wire RT via the pantograph PG is stepped down to, for example, 3.3 kV AC voltage by an insulated main transformer MTR. This stepped-down AC voltage is forward converted to a DC voltage (3.3 kV) by a converter CON. Subsequently, the DC voltage obtained through the conversion executed by the converter CON is input into an inverter INV via a capacitor CL, and converted into a three-phase AC voltage whose three phases are shifted by 120 degrees from each other. Then, the three-phase AC voltage obtained through the conversion executed by the inverter INV is supplied to a three-phase motor MT. Accordingly, the three-phase motor MT is driven, and the wheels WHL of the railway vehicle are rotated, which makes it possible for the railway vehicle to run.

Figure 2:
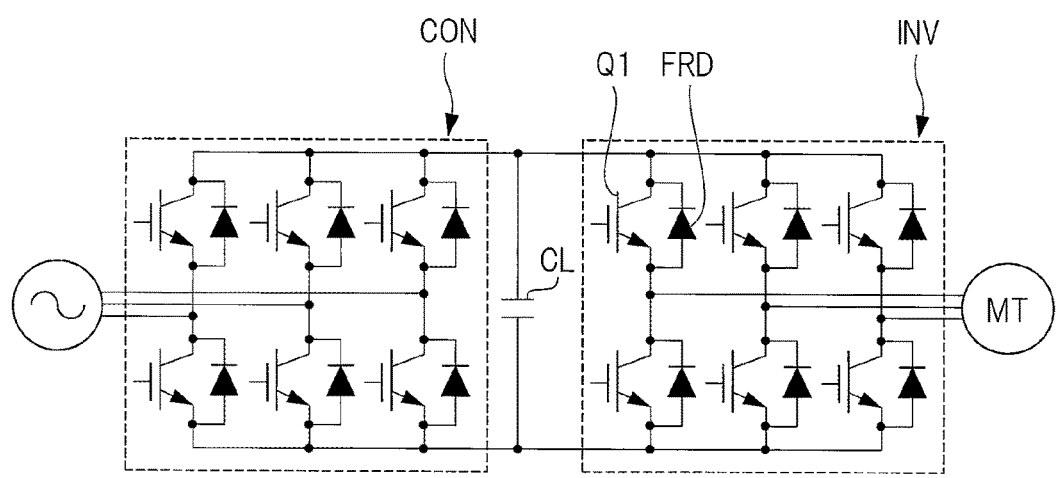
FIG. 2 is a circuit diagram showing the circuitries of a converter and an inverter shown in FIG. 1.

As mentioned above, a three-phase motor system for a railway vehicle includes a converter CON and an inverter INV. FIG. 2 is a circuit diagram showing the circuitries of the converter CON and the inverter INV shown in FIG. 1. As shown in FIG. 2, each of the converter CON and the inverter INV includes six power transistors Q1 and six freewheel diodes FRD. For example, when attention is focused on the inverter INV, an upper arm (high side switch) and a lower arm (low side switch) are provided for each of the three phases (U phase, V phase, and W phase), and each of the upper arm and the lower arm includes one power transistor Q and one free wheel diode FRD that are connected in parallel with each other. In this case, while a power transistor Q1 functions as a switching element, a free wheel diode functions as a rectifying element that flows a reflux current caused by an inductor included in the three-phase motor MT.

As mentioned above, power semiconductor elements such as the power transistor Q1 and the free wheel diode FRD are used as main components having a switching function or a rectifying function in electric power conversion devices such as the inverter INV and the converter CON. For example, an IGBT (insulated gate bipolar transistor), in which silicon (Si) is used as its substrate material, is used as the power transistor Q1, and a pn junction diode, in which silicon (Si) is used as its substrate material, is used as the free wheel diode FRD.

In terms of substrate materials for power semiconductor elements, the usage of wide band gap semiconductor materials, which have band gaps larger than that of silicon material, has been examined recently, and power semiconductor elements using these wide band gap semiconductor materials are being developed. This is because, owing to the band gaps of the wide band gap semiconductor materials being larger than that of silicon, the wide band gap semiconductor materials have dielectric breakdown electric field intensities higher than that of silicon. To put it plainly, since the dielectric breakdown electric field intensity of a power semiconductor element, in which a wide band gap semiconductor material is used, is higher than that of silicon, even if the thickness of the drift layer (epitaxial layer) of the power semiconductor element, in which the wide band gap semiconductor material is used, is set thinner than that of a power semiconductor element, in which silicon is used as its substrate material, a sufficient withstand voltage can be secured. In addition, in a power semiconductor element in which a wide band gap semiconductor material is used, the on-resistance of the power semiconductor element can be reduced by setting the thickness of the drift layer of the power semiconductor element thin. In other words, in a power semiconductor element in which a wide band gap semiconductor material is used as its substrate material, there can be obtained an advantage in that the securement of a withstand voltage and the reduction of an on-resistance between which there is a tradeoff relation can be satisfied at the same time.

Although silicon carbide (SiC), gallium nitride (GaN), or diamond can be cited, for example, as a wide band gap semiconductor material, the following description will be made with attention being focused on SiC.

Since the dielectric breakdown electric field intensity of SiC, which is a wide band gap semiconductor material, is about one digit larger than that of silicon, the on-resistance of a power semiconductor element using SiC can be made low. This is because, as mentioned above, a sufficient withstand voltage can be secured owing to the high dielectric breakdown electric field intensity of a power semiconductor element using SiC even if its drift layer (epitaxial layer) is thin, which leads to the reduction of the on-resistance. Furthermore, the thermal conductivity of SiC is about three times that of silicon and the semiconductor properties of SiC are superior to those of Si, therefore a power semiconductor element using SiC is more suitable to be used in a high-temperature environment.

In view of this, recently it has been examined to replace power semiconductor elements using silicon as their substrate materials with power semiconductor elements using SiC as their substrate materials. Taking up an inverter INV as a concrete example, when developments about a switching element and a rectifying element included in the inverter INV are compared with each other, the development, in which a pn junction diode using silicon as its substrate material is replaced with a pn junction diode using SiC as its substrate material (this pn junction diode is referred to as an SiC-pn diode hereinafter) as a free wheel diode FRD that is a rectifying element, is taking a lead.

In addition, it has also been examined to replace an Si-IGBT with an IGBT using SiC as its substrate material (hereinafter, referred to as an SiC-IGBT) as a power transistor Q1 that is a switching element. This is because an SiC-IGBT can provide a larger amount of driving current to a three-phase motor (a load) than an SiC-MOSFET having its withstand voltage equal to the withstand voltage of the SiC-IGBT, and because the SiC-IGBT has its withstand voltage higher than the withstand voltage of an Si-IGBT as well, the number of parts used in one device can be reduced when SiC-IGBTs are used. Accordingly, it becomes possible to make the size (volume) of the three-phase motor system small. This leads to, for example, the downsizing of underfloor parts including the three-phase motor system, and thereby the height of the floor of the railway vehicle can be made lower. Furthermore, the downsizing of the underfloor parts makes it possible to reserve a space, in which a new secondary battery SB (refer to FIG. 1) can be installed, in a part of the railway vehicle, and therefore electric power can be accumulated in the second battery SB during a time period when the railway vehicle is not running instead of the electric power being returned to the overhead wire RT via the wheel WHL. Accordingly, the regeneration efficiency of the railway vehicle can be improved. In other words, the life cycle cost of the railway system can be reduced.

The object of this embodiment is to improve the capabilities of electric power conversion devices typified by the inverter INV by exercising the ingenuities for improving the property of an SiC-pn junction diode particularly under the assumption that the freewheel diode FRD is formed of this SiC-pn junction diode. Hereinafter, the technological concept of this first embodiment, in which the ingenuities are exercised about an SiC-pn junction diode, will be described.

Advantage of Mesa Structure

Figure 3:
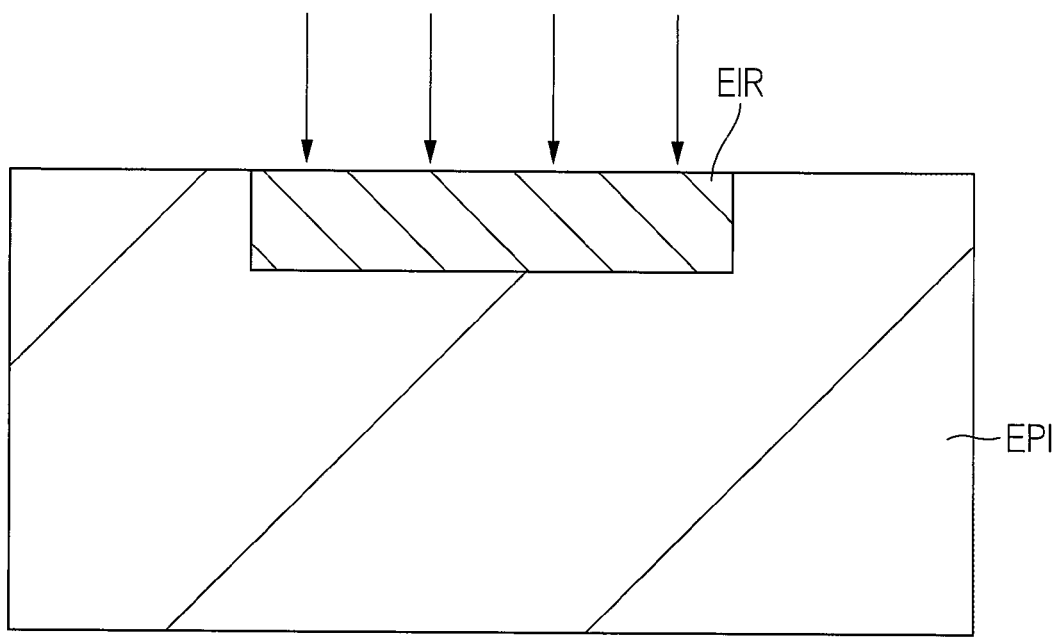
FIG. 3 is a diagram showing the formation of a pn junction using an ion implantation method in a schematic way.

First, a reason why a mesa structure is adopted in an SiC-pn junction diode will be explained. An SiC-pn junction diode has to include a mesa structure in order to have a rectifying property. In this case, for example as shown in FIG. 3, a technology in which an electric charge implantation region EIR, which is a p-type semiconductor region, is formed by implanting p-type impurities into a part of the surface region of a drift layer (epitaxial layer) EPI that is an n-type semiconductor layer using an ion implantation method is thought of. In the case of this technology, a pn junction is formed between the drift layer EPI and the electric charge implantation region EIR. In reality, when the ion implantation method is used, the crystal structure of the drift layer EPI is broken by the implantation energy of the method. In addition, although usually activation annealing is conducted in order to recover the crystal structure after the ion implantation method is performed, in fact it is difficult for the broken crystal structure of the drift layer EPI made of SiC to be recovered even if this activation annealing is conducted on the broken crystal structure. It should be noted that, although the electric charge implantation region EIR is a region through which holes are implanted into the drift layer EPI, the life times of holes become short especially when the crystal structure of the electron charge implantation region has been broken. Therefore, there is a worry that some of holes vanish before these holes are implanted into the drift layer EPI through the electron implantation region EIR. This means that the number of holes implanted into the drift layer EPI becomes smaller, with the result that the number of pairs of holes and electrons that vanish in the drift layer EPI becomes smaller. This means that a forward current flowing through the SiC-pn junction diode becomes smaller, and in other words, the on-resistance of the SiC-pn diode becomes larger. This is because it becomes difficult to improve the property of the SiC-pn diode using the technology in which the electric charge implantation region EIR is formed by the ion implantation method.

Figure 4:
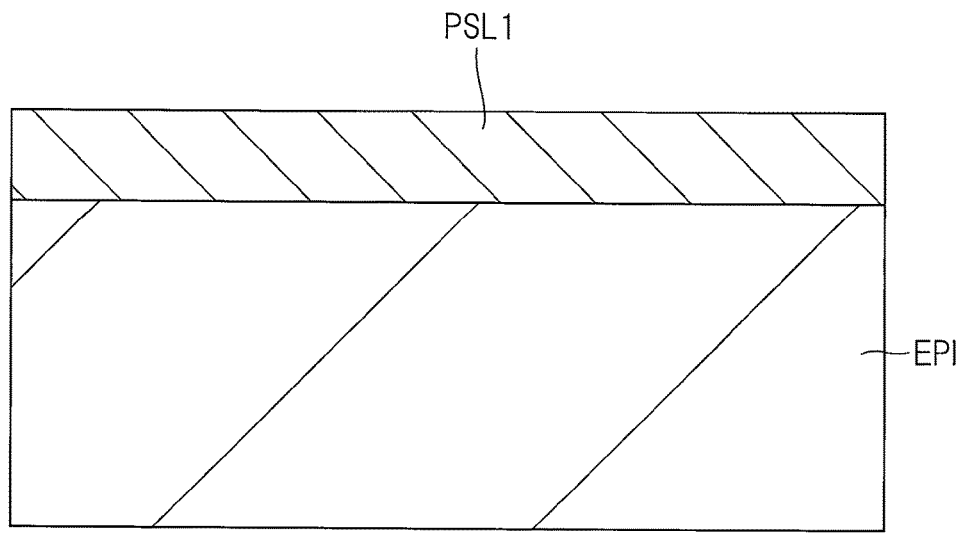
FIG. 4 is a diagram showing the formation of a pn junction using an epitaxial growth method in a schematic way.

Therefore, the mesa structure is adopted in forming an SiC-pn junction diode. Hereinafter, the advantage of the mesa structure will be explained. First, as shown in FIG. 4, a p-type semiconductor layer PSL1 is formed on a drift layer EPI which is an n-type semiconductor layer EPI using, for example, an epitaxial growth method. In this case, since the epitaxial growth method is a method in which crystals are grown from a foundation layer, the crystals of the foundation material are not damaged unlike the case of an ion implantation method in which ions with high energies are implanted. From this angle, it is considered that, if the p-type semiconductor layer PSL1, which has been formed using the epitaxial growth method, is used as an electric charge implantation region, an electric charge implantation region whose crystal structure is little damaged can be formed. However, in a real SiC-pn junction diode, it is necessary to form an electric field relaxation region whose impurity concentration is smaller than that of the electric charge implantation region in the outer edge region of the relevant semiconductor chip to secure the sufficient withstand voltage of the SiC-pn junction diode. Accordingly, it is impossible to form an electric charge implantation region and an electric field relaxation region whose impurity concentrations are different from each other in the p-type semiconductor layer PSL1 that is simply formed on the drift layer EPI as shown in FIG. 4.

Figure 5:
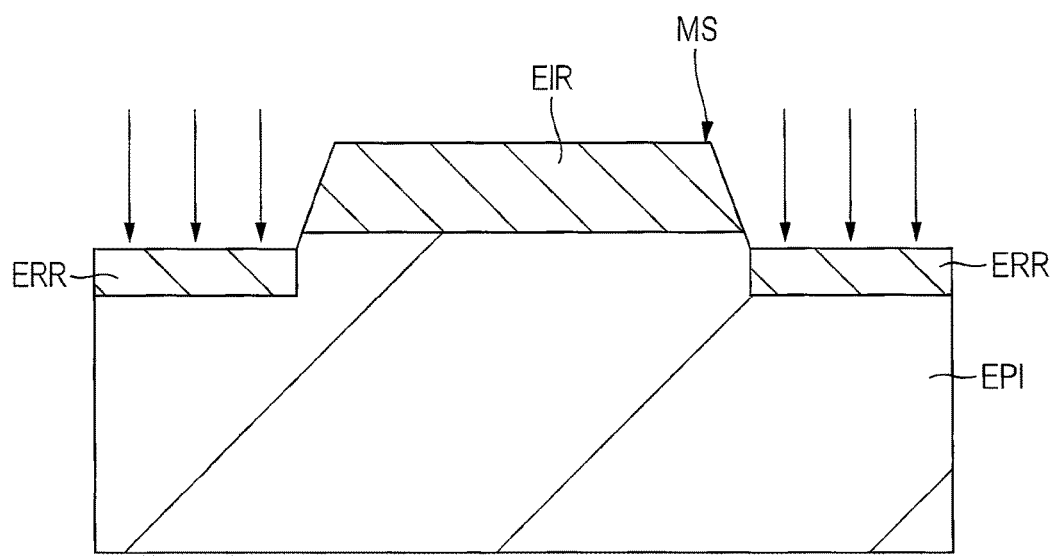
FIG. 5 is a diagram for explaining the necessity for forming a mesa structure.

Therefore, as shown in FIG. 5, a mesa structure MS is formed by processing the p-type semiconductor layer PSL1 by means of, for example, a photo lithography technology and an etching technology. In this case, as shown in FIG. 5, an electric charge implantation region EIR can be formed on the inside of the mesa structure MS, and at the same time, an electric field relaxation region ERR whose impurity concentration is smaller than that of the electric charge implantation region EIR can be formed on the outside of the mesa structure MS by means of, for example, an ion implantation method. To put it plainly, the adoption of the mesa structure MS makes it possible that the electric charge implantation region EIR whose crystal structure is little damaged is formed using the epitaxial growth method, and at the same time, the electric field relaxation region ERR whose impurity concentration is smaller than that of the electric charge implantation region EIR is formed on the outside of the mesa structure MS. The abovementioned point is the advantage of the mesa structure MS, and this mesa structure MS is adopted in the SiC-pn junction diode according to this first embodiment.

Device Structure of SiC-pn Junction Diode

Next, the device structure of an SiC-pn junction diode, which is formed on the basis of the above-described mesa structure MS, according to the first embodiment will be explained with reference to the accompanying drawings.

Figure 6:
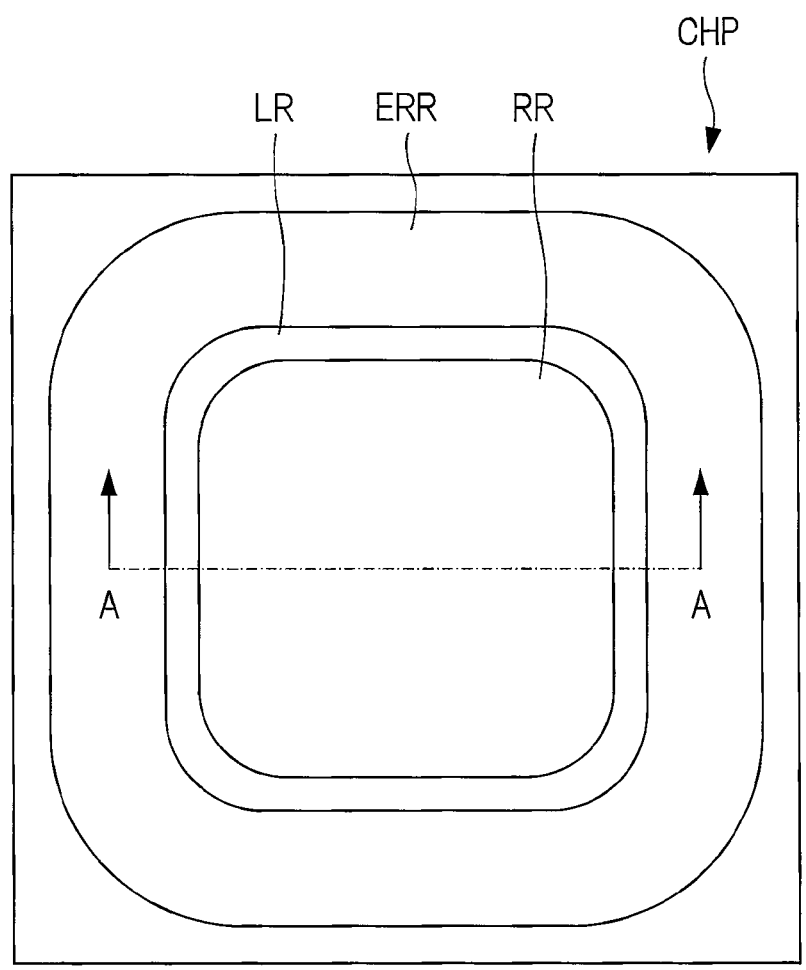
FIG. 6 is a plan view showing the plane structure of a semiconductor chip in which an SiC-pn junction diode is formed according to a first embodiment in a schematic way.

FIG. 6 is a plan view showing the plane structure of a semiconductor chip CHP forming the SiC-pn junction diode according to this first embodiment in a schematic way. As shown in FIG. 6, the semiconductor chip CHP according to this first embodiment is rectangle-shaped, and a resistance reduction region RR is formed in the central region of the semiconductor chip CHP. Furthermore, a leakage reduction region LR is formed on the outside of this resistance reduction region RR in a way that the leakage reduction region LR surrounds the resistance reduction region RR, and an electric field relaxation region ERR is formed on the outside of this leakage reduction region LR in a way that the electric field relaxation region ERR surrounds the leakage reduction region LR.

Figure 7:
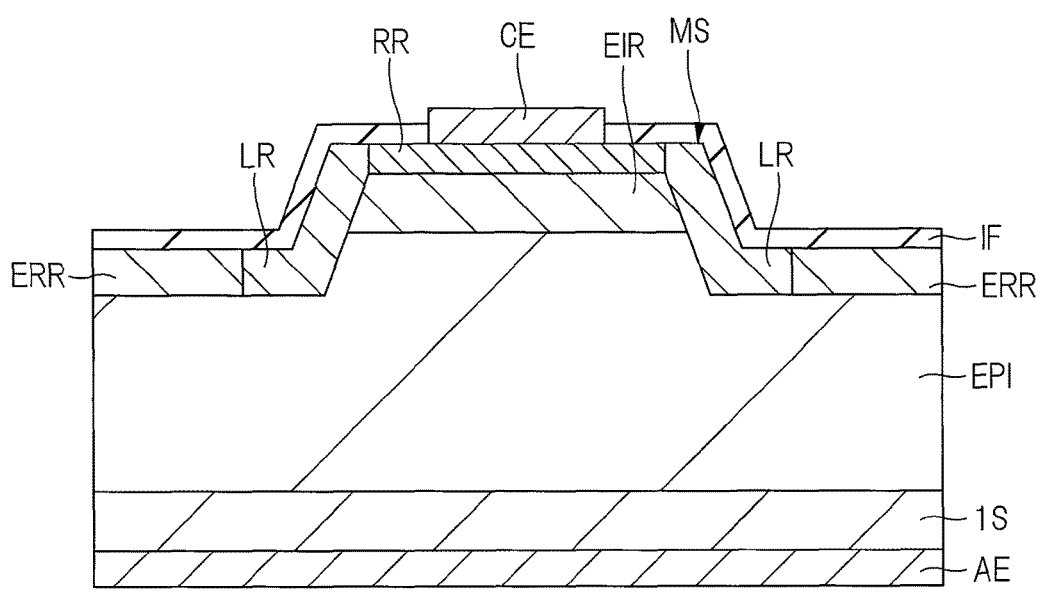
FIG. 7 is a cross-sectional view taken along the line A-A in FIG. 6.

Next, FIG. 7 is a cross-sectional view taken along the line A-A in FIG. 6. As shown in FIG. 7, the SiC-pn junction diode according to this first embodiment includes a silicon carbide substrate 1S, and an anode electrode AE, which is made of metal film, is formed on one surface (rear surface) of this silicon carbide substrate 1S. On the other hand, for example, adrift layer EPI formed by an epitaxial growth method is formed on another surface (front surface) of the silicon carbide substrate 1S. The impurity concentration of conductivity type impurities (n-type impurities) implanted into this drift layer EPI is set lower than the impurity concentration of conductivity type impurities (n-type impurities) implanted into the silicon carbide substrate 1S. With this, the SiC-pn junction diode can secure a sufficient withstand voltage.

Next, as shown in FIG. 7, the SiC-pn junction diode according to this first embodiment includes a mesa structure MS formed on the surface of the drift layer EPI. In this case, the electric field relaxation region ERR, which is a p-type semiconductor region, is formed in the outer edge region on the outside of the mesa structure MS. In addition, an electric charge implantation region EIR, which is formed on the drift layer EPI, and a p-type semiconductor region, and the resistance reduction region RR, which is formed on the electric charge implantation region EIR, and a p-type semiconductor region, are formed in the mesa structure MS. Furthermore, the leakage reduction region LR, which is formed at the sidewall portion of the mesa structure MS, and adjacent to the resistance reduction region RR, the electric charge implantation area EIR and the electric field relaxation region ERR and that is a p-type semiconductor region, is formed in the mesa structure MS.

Here, in the SiC-pn junction diode according to this first embodiment, the impurity concentration of the leakage reduction region LR is set larger than the impurity concentration of the electric field relaxation region ERR, and is set smaller than the impurity concentration of the resistance reduction region RR.

Next, in the SiC-pn junction diode according to this first embodiment, an insulating film IF made of, for example, an oxide silicon film is formed on the surface of the drift layer EPI that covers the mesa structure MS. Accordingly, the insulating film IF makes contact with the sidewall portion of the mesa structure MS. In this way, the insulating film IF makes contact with the electric relaxation region ERR as well as the leakage reduction region LR. In addition, an opening is formed in the insulating film, and a cathode electrode CE, which is made of, for example, metal film, is formed in such a way that the cathode electrode fills the opening and makes contact with the resistance reduction region RR. In this way, the device structure of the SiC-pn junction diode according to this first embodiment is fabricated.

In particular, in the SiC-pn junction diode according to this first embodiment, the mesa structure MS is adopted as shown in FIG. 7. Accordingly, it is possible to obtain an advantage that the electric charge implantation region EIR whose crystal structure is little damaged can be formed using the epitaxial growth method, and at the same time, the electric field relaxation region ERR whose impurity concentration is smaller than that of the electric charge implantation region EIR can be formed on the outside of the mesa structure MS.

In this case, since the electric field relaxation region ERR is formed in the outer edge region on the outside of the mesa structure MS in the SiC-pn diode according to this first embodiment, the improvement of the withstand voltage of the diode can be obtained. This is because a channel stopper layer is formed in the outer region on the front surface side of the semiconductor chip and the potential of the channel stopper layer is set equal to that of the anode electrode AE formed on the rear surface of the semiconductor chip, although the channel stopper layer is not shown in FIG. 7. In the case where a backward voltage is being applied to the SiC-pn junction diode, a depletion layer extends from the channel stopper layer to the electric field relaxation region ERR, so that the withstand voltage of the SiC-pn junction diode can be secured. In other words, forming the electric field relaxation region ERR whose impurity concentration is low so as to lie adjacent to the channel stopper layer makes it possible that, when a backward voltage is applied to the SiC-pn junction diode, the width of the depletion layer that extends in a lateral direction (in a parallel direction with the surface) can be widened, with the result that the withstand voltage of the SiC-pn junction diode can be improved. To put it plainly, it can safely be said that, in the SiC-pn junction diode according to this first embodiment, the electric field relaxation region ERR is formed to improve the withstand voltage when a backward voltage is applied.

Furthermore, in the SiC-pn junction diode according to this first embodiment, the resistance reduction region RR is formed between the electric charge implantation region EIR and the cathode electrode CE, for example, as shown in FIG. 7. This resistance reduction region RR has a function to secure an ohmic contact between the cathode electrode CE and the semiconductor regions and to reduce resistance. Accordingly, in order to secure the ohmic contact, the impurity concentration of conductivity type impurities (p-type impurities) that are implanted into the resistance reduction region RR having direct contact with the cathode electrode CE is set larger than that of conductivity type impurities (p-type impurities) that are implanted into the electric charge implantation region EIR.

Feature of First Embodiment

Next, the feature of this first embodiment will be explained. The feature of this first embodiment is that, for example in FIG. 7, the impurity concentration of the conductivity type impurities (p-type impurities) implanted into the leakage reduction region LR is set larger than that of the conductivity type impurities (p-type impurities) implanted into the electric field relaxation region ERR, and set smaller than that of the conductivity type impurities (p-type impurities) implanted into the resistance reduction region RR.

With this, in the SiC-pn junction diode according to this first embodiment, both reduction of the leakage current and suppression of degradation of the conductive characteristic can be satisfied at the same time.

Figure 8:
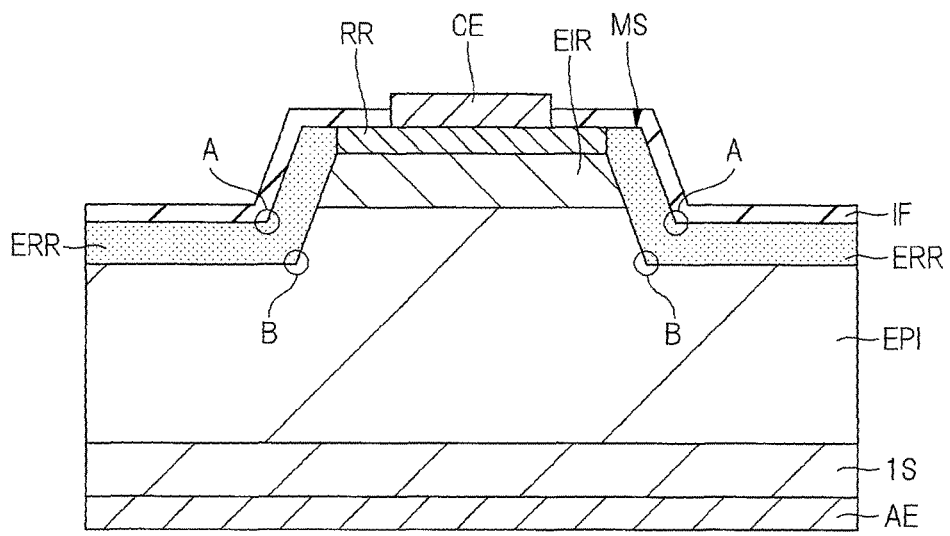
FIG. 8 is a diagram showing in a schematic way a structure in which a semiconductor region whose impurity concentration is low and equal to the impurity concentration of an electric field relaxation region is formed instead of forming a leakage reduction region whose impurity concentration is higher than the impurity concentration of the electric field relaxation region at the sidewall portion of the mesa structure.

Hereinafter, descriptions about this point will be made. FIG. 8 is a diagram showing a structure in which a semiconductor region whose impurity concentration is low and equal to the impurity concentration of an electric field relaxation region ERR is formed instead of forming a leakage reduction region LR whose impurity concentration is higher than the impurity concentration of the electric field relaxation region ERR at the sidewall portion of a mesa structure MS in a schematic way. In FIG. 8, when a backward voltage (a reverse bias) is applied to an SiC-pn junction diode, a depletion layer extends from a channel stopper layer (not shown) that is formed on the outside of the electric field relaxation region ERR to the electric field relaxation region ERR. In this case, as shown in FIG. 8, since the impurity concentration of the semiconductor region formed at the sidewall portion of the mesa structure MS is small and almost equal to that of the electric field relaxation region ERR and small, the depletion layer extending from the channel stopper layer extends not only to the electric field relaxation region ERR, which is formed on the outside of the mesa structure, but also to the semiconductor region formed at the sidewall portion of the mesa structure MS (the depletion region is depicted by "a dotted region").

In this case, as shown in FIG. 8, the depletion layer reaches a corner portion A that is created in the forming process of the mesa structure MS. Since electric field convergence easily occurs at the corner portion A, if the depletion layer reaches the corner portion A, electric field convergence is generated at the corner portion A by an electric field in the depletion region. Therefore, a high electric field is applied to the vicinity of the corner portion A of an insulating film IF covering the mesa structure MS, which increases a leakage current. If the high electric field concentrates at the corner portion A, there is a worry that the dielectric breakdown of the insulating film IF will occur.

On the other hand, in the SiC-pn junction diode shown in FIG. 8, not only the corner portion A but also a corner portion B is formed in the forming process of the mesa structure MS. Here, if a backward voltage is applied to the SiC-pn junction diode, a depletion layer extends from a pn junction formed between a drift layer EPI and the semiconductor region (including the electric field relaxation region ERR) formed at the sidewall portion of the mesa structure MS as well as the depletion layer extending from the channel stopper. If this depletion layer reaches the corner portion B, it is apprehended that electric field convergence occurs even at the portion corner B. However, in the SiC-pn diode according to this first embodiment, SiC having a band gap larger than that of silicon is used, and the thickness of the drift layer EPI is large. Therefore, the backward voltage applied to an anode electrode AE formed on the rear surface of a silicon carbide substrate 1S drops owing to a voltage drop at the drift layer EPI, and in reality the electric field convergence at the corner portion B is more suppressed than the electric field convergence at the corner portion A, with the result that a withstand voltage failure at the corner portion B hardly becomes obvious as a problematic point.

To put it plainly, in the SiC-pn diode according to this first embodiment, the decrease of the withstand voltage of the SiC-pn diode owing to the dielectric breakdown at the corner portion A of the insulating film IF covering the mesa structure MS becomes more obvious as a problematic point than the decrease of the withstand voltage owing to the electric field convergence inside the SiC-pn junction diode (at the corner portion B). The above is a first knowledge that the present inventors have found out.

Figure 9:
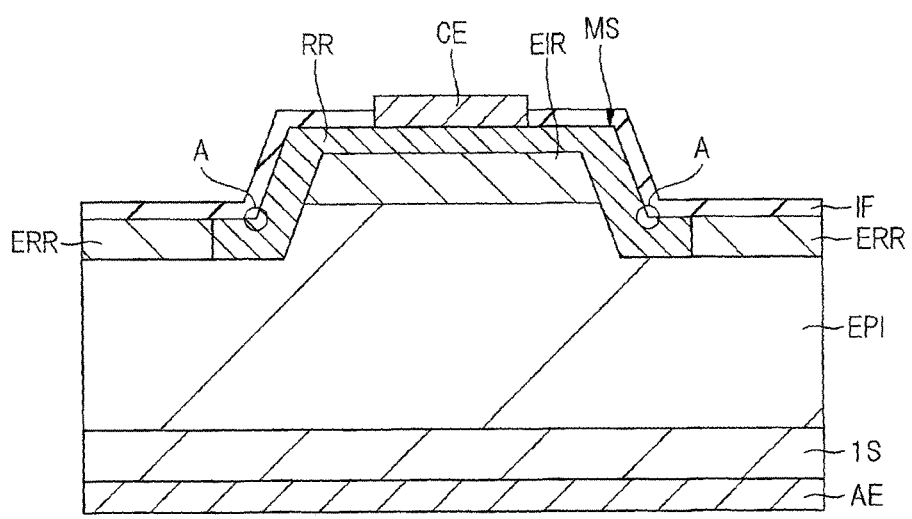
FIG. 9 is a diagram for explaining knowledge the present inventors have found out.

Next, second knowledge that the present inventors have found out will be explained. FIG. 9 is a diagram for explaining the second knowledge that the present inventors have found out. In an SiC-pn junction diode shown in FIG. 9, a resistance reduction region RR with its purity concentration large is formed even at the sidewall portion of a mesa structure MS. In this case, when a backward voltage is applied to the SiC-pn junction diode, while a depletion layer extends from a channel stopper layer (not shown) formed on the outside of an electric field relaxation region ERR to the electric field relaxation region ERR, it is hard for the depletion region to extend to the inside of the resistance reduction region RR because the impurity concentration of the resistance reduction region RR, which lies adjacent to the electric field relaxation region ERR, is large. As a result, in the SiC-pn junction diode shown in FIG. 9, even if the backward voltage is applied to the SiC-pn junction diode, the depletion layer does not extend to a corner portion A, so that electric field convergence at the corner portion A is suppressed. With this, it is believed that the dielectric breakdown of an insulating film IF in the corner portion A can be suppressed in the SiC-pn junction diode shown in FIG. 9.

As described above, in the SiC-pn junction diode shown in FIG. 9, while it is possible to obtain an advantage that the dielectric breakdown of the insulating film IF at the corner portion A can be effectively suppressed, it is revealed that there is room for improvement as a result of an examination conducted by the present inventors, and therefore descriptions will be made in this regard hereinafter.

Figure 10:
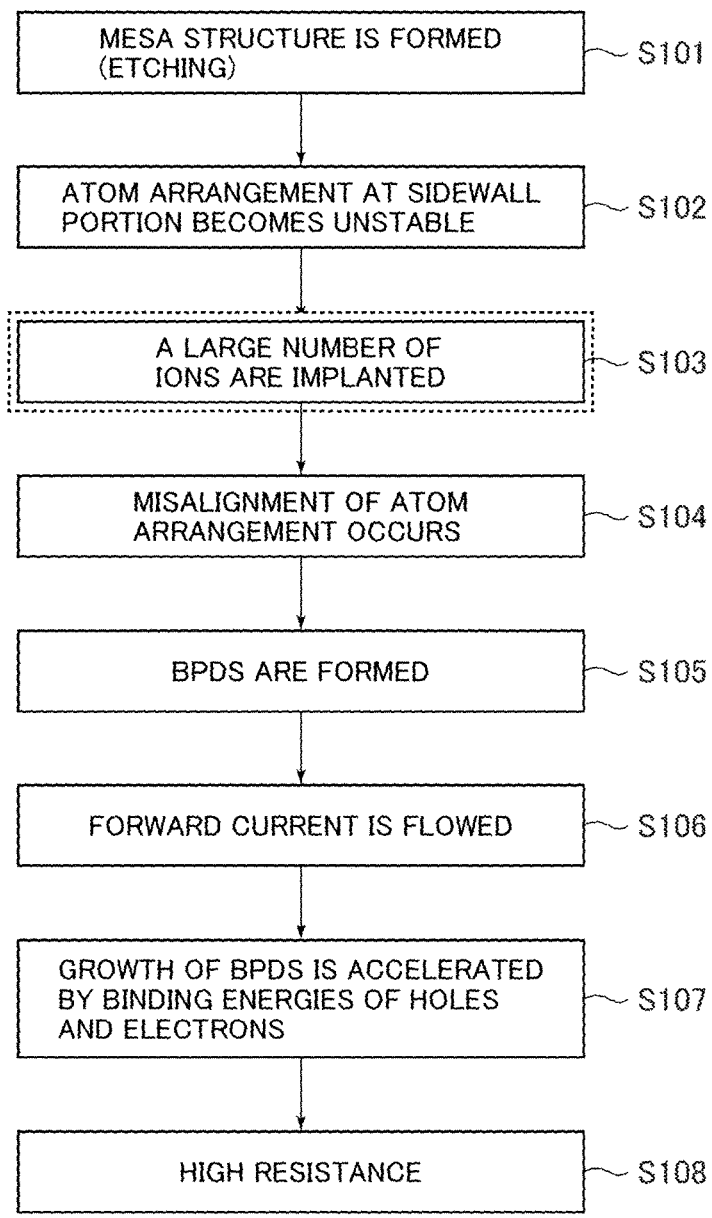
FIG. 10 is a flowchart for explaining room for improvement that is newly generated in an SiC-pn junction diode shown in FIG. 9.

FIG. 10 is a diagram for explaining room for improvement that is newly brought about by the SiC-pn junction diode shown in FIG. 9. First, in order for the SiC-pn diode shown in FIG. 9 to include a mesa structure, the mesa structure is formed by, for example, using a photolithography technology and an etching technology (at step S101). In this case, since the sidewall portion of the mesa structure is exposed to etching, the atom arrangement of atoms included in the sidewall portion becomes unstable (at step S102). To put it plainly, off angles are formed in a drift layer formed of silicon carbide (SiC) itself, and the arrangement of the silicon carbide atoms is out of horizontal alignment. A multiplier cause brought about by both above misalignment and exposure of the sidewall portion of the mesa structure to the etching makes the atom arrangement of the silicon carbide atoms at the sidewall portion of the mesa structure unstable. Furthermore, in order to form a resistance reduction region whose impurity concentration is large at the sidewall portion of the mesa structure in such an unstable condition of the atom arrangement, conductivity type impurities (p-type impurities) are implanted into the sidewall portion of the mesa structure using an ion implantation method. In this case, since the impurity concentration of the resistance reduction region is large, the number of the impurities implanted by the ion implantation method becomes large (at step S103). Considering that conductivity type impurities are implanted with a large amount of implantation energy, the impurity concentration of the conductivity type impurities implanted by the ion implantation method becoming larger means that a possibility that the atom arrangement at the sidewall portion of the mesa structure is disturbed becomes larger correspondingly. In other words, in a structure where a resistance reduction region whose impurity concentration is high is formed at the sidewall portion of a mesa structure, the misalignment of the atom arrangement at the sidewall portion of the mesa structure easily becomes obvious. In addition, if such a misalignment of the atom arrangement occurs, "BPDs (basal plane dislocations)", which are two-dimensional defects, are easily formed, for example (at step S105). In this situation, if a forward current is flowed through the SiC-pn junction diode (at step S106), the growth of "BPDs" is accelerated by binding energies of holes and electrons (at step S107). In this case, since the relevant on-resistance increases along with the increase of the number of "BPDs", the property of the SiC-pn diode is deteriorated. For example, in order to flow the same amount of forward current, the relevant forward current has to be increased, and put it differently, if the forward voltage is kept constant, the forward current is decreased.

If "BPDs" grow, "BPDs" reach an electric charge implantation region, and if "BPDs" are formed in the electric charge implantation region, the life times of holes, which are majority carriers in the electric charge implantation region, become short owing to these "BPDs", which decreases the number of holes implanted from the electric charge implantation region into the drift layer. This means that the number of combinations of holes and electrons in the drift layer becomes small, and, this means that the on-resistance of the SiC-pn junction diode is increased. Therefore, it becomes important to suppress the generation of "BPDs" in the electric charge implantation region in the SiC-pn junction diode, and this means that it is important to suppress the growth of "BPDs" from the sidewall portions of the mesa structure where "BPDs" are easily generated. From this point of view, in this embodiment, while attention is focused on the sidewall portion of the mesa structure, how to suppress the generation of "BPDs" at the sidewall portion of the mesa structure itself is considered.

As described above, in the SiC-pn junction diode shown in FIG. 9, it has been revealed through examinations by the present inventors that, while it is considered possible to obtain an advantage that the dielectric breakdown of the insulating film IF owing to the electric field convergence can be suppressed, the degradation of the SiC-pn junction diode typified by the increase of the on-resistance owing to the increase of "BPDs" easily becomes obvious. The above point is the second knowledge found out by the present inventors.

Therefore, on the basis of the first and second knowledge newly found out, the present inventors have come up with a technological idea in which both reduction of the leakage current (including the dielectric breakdown of the insulating film) and suppression of degradation of the conductive characteristic (suppression of the increase of the forward voltage) are satisfied at the same time. To put it concretely, as mentioned above, the impurity concentration of the conductivity type impurities implanted into the leakage reduction region LR is set larger than that of the conductivity type impurities implanted into the electric field relaxation region ERR, and set smaller than that of the conductivity type impurities implanted into the resistance reduction region RR in this first embodiment.

Figure 11:
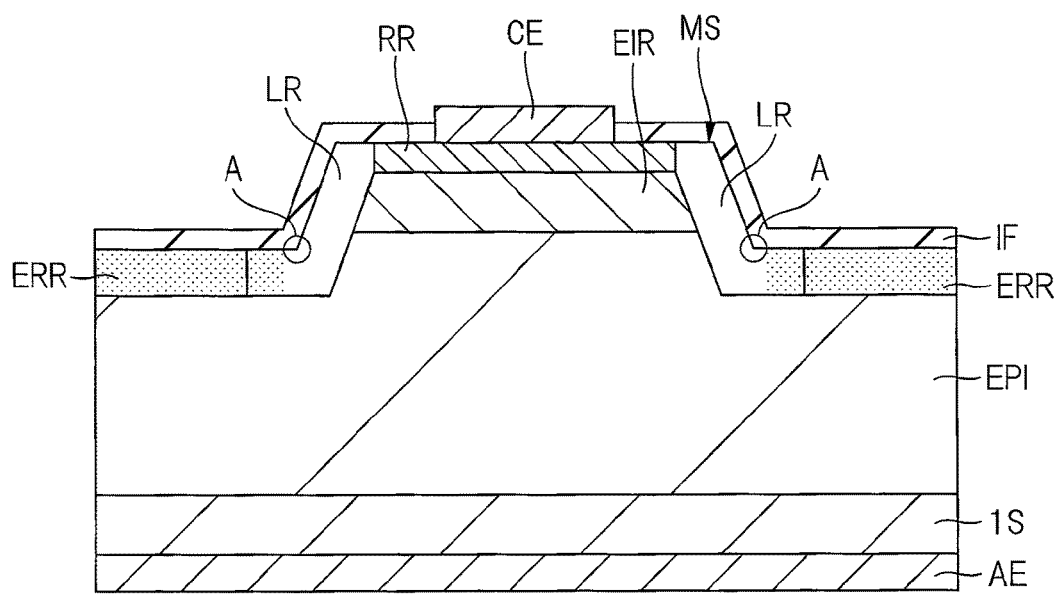
FIG. 11 is a schematic diagram showing the state of the SiC-pn junction diode according to the first embodiment in the case where a backward voltage is applied to the SiC-pn junction diode.

First, it will be explained that the reduction of a leakage current (including the dielectric breakdown of an insulating film) can be attained more easily in comparison with the SiC-pn junction diode shown in FIG. 8 according to this structure. FIG. 11 is a schematic diagram showing the state of the SiC-pn junction diode according to this first embodiment in the case where a backward voltage is applied to the SiC-pn junction diode. As shown in FIG. 11, when the backward voltage is applied to the SiC-pn junction diode according to this first embodiment, a depletion layer extends from a channel stopper layer (not shown) formed on the outside of an electric field relaxation region ERR to the electric field relaxation region ERR, and the depletion layer further extends to a leakage reduction region LR lying adjacent to the electric field relaxation region ERR. However, in this first embodiment, the impurity concentration of conductivity type impurities implanted into the leakage reduction region LR is set larger than that of the conductivity type impurities implanted into the electric field relaxation region ERR. Therefore, for example, as shown in FIG. 11, the depletion layer is prevented from extending in the leakage reduction region LR. Accordingly, it is possible to prevent the depletion layer from reaching a corner portion A generated by a mesa structure MS. This means that it becomes difficult that electric field convergence occurs owing to an electric field in the depletion layer, which can suppress the electric field convergence at the corner portion A. With this, in the SiC-pn junction diode according to this first embodiment, the dielectric breakdown of an insulating film IF covering the corner portion A (the increase of a leakage current) can be prevented from occurring, which leads to the improvement of the reliability of the SiC-pn junction diode.

On the other hand, in the SiC-pn junction diode according to this first embodiment, the impurity concentration of the conductivity type impurities implanted into the leakage reduction region LR is set smaller than that of the conductivity type impurities implanted into the resistance reduction region RR. As a result, for example, the increase of the on-resistance of the SiC-pn junction diode (the increase of the forward voltage, the decrease of the forward current) owing to the generation of the "BPDs" shown in FIG. 10 can be suppressed. This is because, in the SiC-pn junction diode according to this first embodiment, the impurity concentration of the conductivity type impurities implanted into the leakage reduction region LR which is formed at the sidewall portion of the mesa structure MS is set smaller than that of the conductivity type impurities implanted into the resistance reduction region RR. In other words, this is because the impurity concentration of the conductivity type impurities implanted into the leakage reduction region LR becoming small makes it possible to suppress the increase of the on-resistance owing to the "BPDs" formed through a mechanism shown in FIG. 10. To put it plainly, since the increase of the number of the implanted ions of the conductivity type impurities at "step S103" shown in FIG. 10 directly leads to the generation of the "BPDs", the impurity concentration of the conductivity type impurities becoming small means the number of the implanted ions being small correspondingly. In other words, this is because the number of the implanted ions being small means that the occurrence of the misalignment of the atom arrangement at the sidewall portion of the mesa structure MS can be suppressed, which makes it possible to suppress the generation of "BPDs" brought about by the misalignment of the atom arrangement.

Judging from the above, the feature of this first embodiment that the impurity concentration of the leakage reduction region LR is larger than that of the electric field relaxation region ERR, and smaller than that of the resistance reduction region makes it possible to satisfy both reduction of the leakage current (suppression of the dielectric breakdown) and suppression of the degradation of the conductive characteristic (suppression of the increase of the forward voltage) at the same time. With this, according to this first embodiment, a remarkable advantageous effect that, while the reliability of an SiC-pn junction diode can be improved, the property of the SiC-pn junction diode can be improved as well can be attained. As described above, according to the technological idea (feature) of this first embodiment, rooms for improvement brought about by the presence of the corner portion A where electric charges tend to concentrate owing to the adoption of the mesa structure MS and the presence of the sidewall portion where the atom arrangement tends to be disturbed owing to the adoption of the mesa structure MS can be solved. Therefore, it will be understood that the technological idea of this first embodiment is a useful technological idea especially when it is applied to a semiconductor device that includes a mesa structure MS and uses silicon carbide.

Verification of Advantageous Effect

Figure 12:
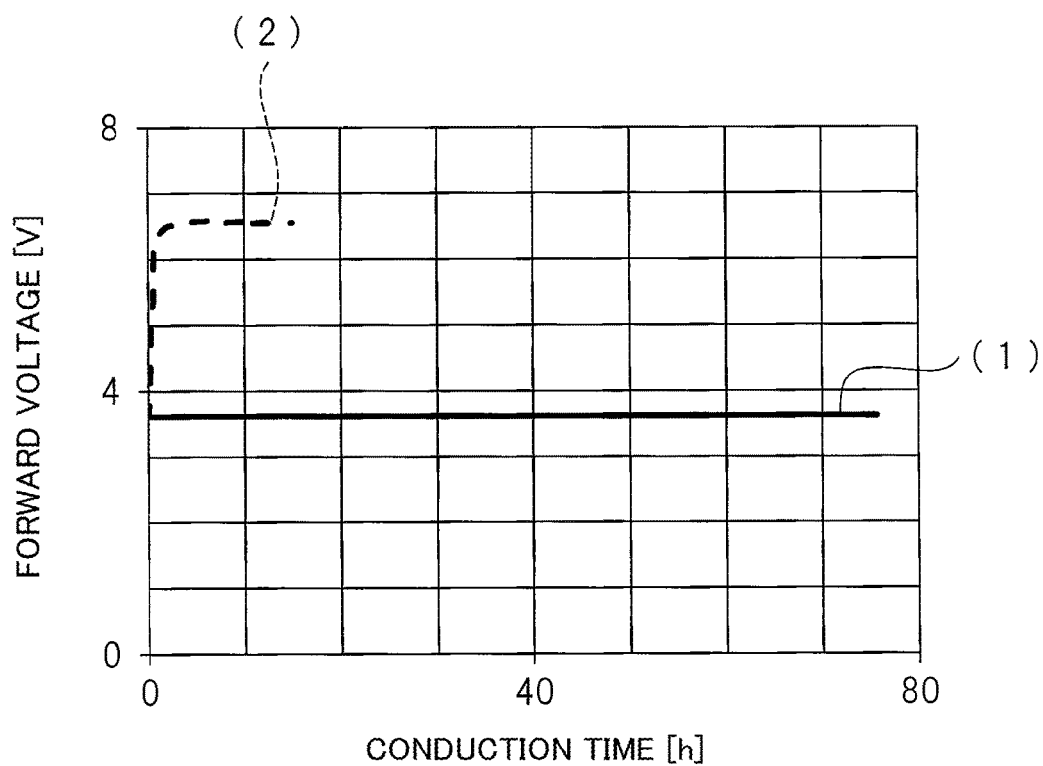
FIG. 12 is a graph showing the behavior of a forward voltage in the case where a forward current is kept flowing through the SiC-pn diode.

Next, a result of verification whether it is possible to suppress the increase of the forward voltage (equivalent to the increase of the on-resistance) even if the forward current is kept flowing according to the feature of this first embodiment will be explained. FIG. 12 is a graph showing the behavior of the forward voltage of an SiC-pn junction diode in the case where the forward current is kept flowing through the SiC—PN diode. In FIG. 12, the horizontal axis represents the conduction time of the forward current, and the vertical axis represents the value of the forward voltage.

First, in a graph shown in FIG. 12, "(1)" denotes a characteristic of the SiC-pn junction diode according to this first embodiment. On the other hand, "(2)" denotes a characteristic of the SiC-pn junction diode shown in FIG. 9. As shown by "(1)" in FIG. 12, it is understood that the value of the forward voltage of the SiC-pn junction diode according to this first embodiment is almost constant during a long conduction time of the forward current of the SiC-pn junction diode. To put it concretely, it is backed up in the SiC-pn-junction diode according to this first embodiment that, since the impurity concentration of the leakage reduction region formed at the sidewall portion of the mesa structure is small, the generation of "BPDs" is suppressed. This is because, if a large number of "BPDs" have been generated, "BPDs" grow into the electric charge implantation region by the binding energies of electrons and holes in the case where the forward current is kept flowing, which leads to the increase of the forward voltage of the SiC-pn junction diode (the increase of the on-resistance). In other words, according to the feature of this first embodiment, since the generation of "BPDs" at the sidewall portion of the mesa structure is particularly suppressed, the number of "BPDs", which are seeds of a growing number of "BPDs", becomes small even if the forward current is kept flowing, with the result that the increase of the forward voltage is suppressed.

On the other hand, as shown by "(2)" in FIG. 12, it is understood that the value of the forward voltage of the SiC-pn junction diode shown in FIG. 9 increases along with the conduction time of the forward current. This is because it is considered that, in the SiC-pn junction diode, the impurity concentration of the resistance reduction region formed at the sidewall portion of the mesa structure becomes large, and therefore a large number of "BPDs", which are seeds of a growing number of "BPDs", are formed in the resistance reduction region. In other words, it is considered that, in the SiC-pn junction diode shown in FIG. 9, since a large number of "BPDs" are formed at the sidewall portion of the mesa structure, the growth of "BPDs" occurs to reach the electric charge region by the conduction of the forward current, with the result that the forward voltage increases.

As described above, it is backed up from FIG. 12 that, in the SiC-pn junction diode according to this first embodiment, the degradation of the conductive characteristic (concretely speaking, the increase of the forward voltage) of the SiC-pn junction diode can be suppressed by adopting a structure in which the generation of "BPDs" formed at the sidewall portion of the mesa structure is suppressed. To put it concretely, in the SiC-pn junction diode according to this first embodiment, balance is achieved in such a way that, while the impurity concentration of the leakage reduction region formed at the sidewall portion of the mesa structure is set large to the extent that the depletion layer does not reach the corner portion formed by the mesa structure, the impurity concentration of the leakage reduction region is set smaller than the impurity concentration of the resistance reduction region so that the generation of "BPDs" is suppressed. With this, in the SiC-pn junction diode according to this first embodiment, both reduction of the leakage current (suppression of the dielectric breakdown) and suppression of the degradation of the conductive characteristic (suppression of the increase of the forward voltage) can be satisfied at the same time.

Manufacturing Method of SiC-pn Junction Diode

The SiC-pn junction diode according to this first embodiment is comprised in the above way, and the manufacturing method thereof will be explained with reference to the accompanying drawings hereinafter.

Figure 13:
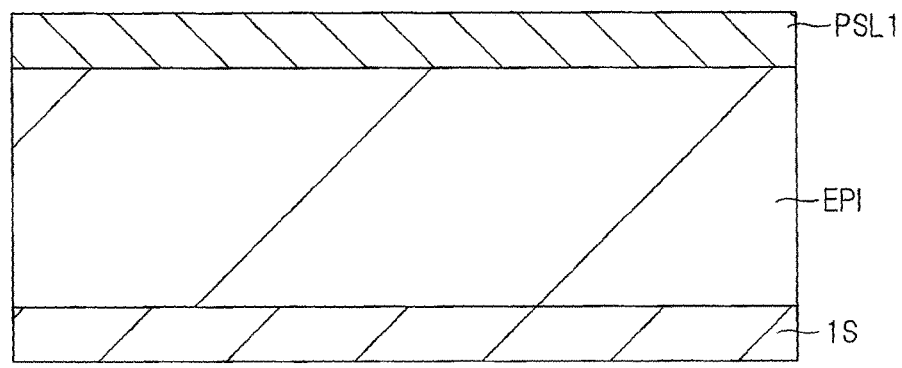
FIG. 13 is a cross-sectional view showing a manufacturing process of the semiconductor device according to the first embodiment.

First, as shown in FIG. 13, a silicon carbide substrate 1S Shaving a drift layer EPI made of n-type semiconductor and a p-type semiconductor layer PSL1 formed on the drift layer EPI is prepared. For example, the silicon carbide substrate 1S can be formed using a sublimation method, and the thickness thereof is 100 μm or larger and smaller than 1000 μm. This silicon substrate 1S is comprised of single crystals of silicon carbide including n-type impurities such as nitrogen (N) and phosphor (P). The impurity concentration of the silicon carbide substrate 1S is, for example, $1 \times 10^{-16}/cm^3$ or larger and smaller than $2 \times 10^{20}/cm^3$. Furthermore, the drift layer EPI can be formed using, for example, an epitaxial growth method, and n-type impurities such as nitrogen (N) and phosphor (P) are implanted into the drift layer EPI. The impurity concentration of the drift layer EPI is, for example, $1 \times 10^{13}/cm^3$ or larger and smaller than $1 \times 10^{18}/cm^3$. In addition, the p-type semiconductor layer PSL1 can be formed using, for example, an epitaxial growth method, and p-type impurities such as aluminum (AL) and boron (B) are implanted. The thickness of this p-type semiconductor layer PSL1 is, for example, 0.5 μm or larger and smaller than 30 μm, and the impurity concentration of the p-type semiconductor layer PSL1 is, for example, $1 \times 10^{17}/cm^3$ or larger and smaller than $1 \times 10^{21}/cm^3$.

Figure 14:
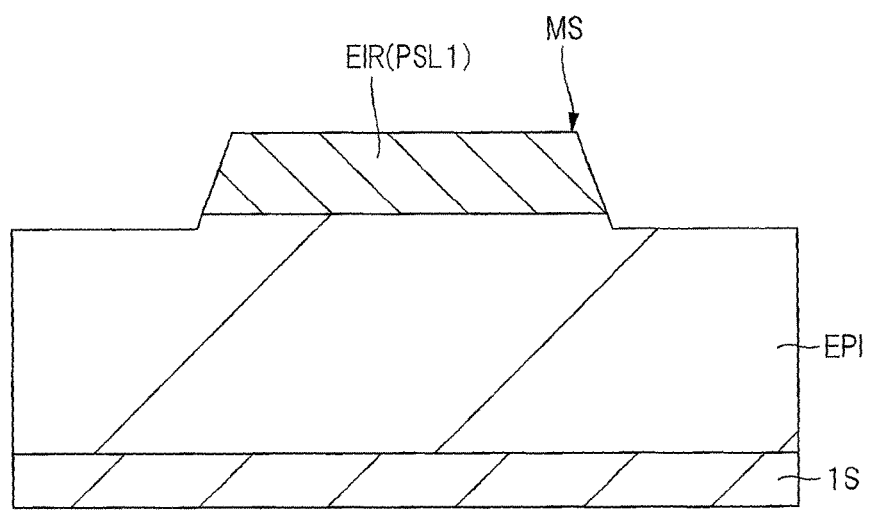
FIG. 14 is a cross-sectional view showing a manufacturing process of the semiconductor device following the manufacturing process shown in FIG. 13.

Next, as shown in FIG. 14, a part of the p-type semiconductor layer PSL1 and a part of the drift layer EPI are etched using a photolithography technology and an etching technology. As a result, a mesa structure MS including an electric charge implantation region EIR formed by processing the p-type semiconductor layer PSL1 and a part of the drift layer EPI lying adjacent to the electric charge implantation region EIR can be formed on the silicon carbide substrate 1S. At this time, because the sidewall portion of the mesa structure MS is exposed to the etching, the atom arrangement of atoms included in the mesa structure MS becomes unstable.

Figure 15:
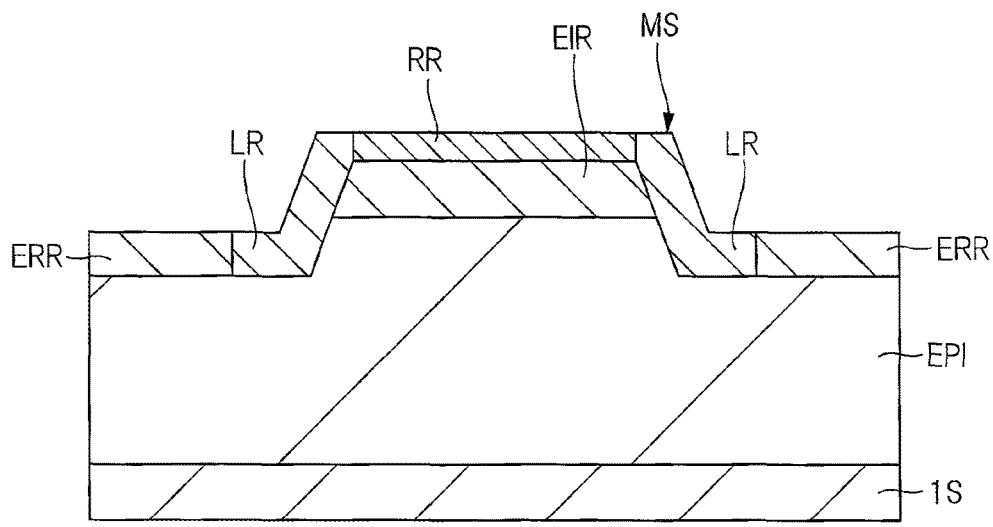
FIG. 15 is a cross-sectional view showing a manufacturing process of the semiconductor device following the manufacturing process shown in FIG. 14.

Next, as shown in FIG. 15, an electric field relaxation region ERR is formed in the outer edge region on the outside of the mesa structure MS using, for example, an ion implantation method. This electric field relaxation region ERR is formed by implanting p-type impurities, and the impurity concentration of the electric field relaxation region ERR is, for example, $1\times10^{14}/cm^3$ or larger and smaller than $1\times10^{18}/cm^3$. By forming this electric field relaxation region ERR, a depletion layer extends to the inside of the electric field relaxation region ERR when a backward voltage is applied, so that it becomes possible to relax electric field convergence at the corner portion of the mesa structure MS. In such a way, the electric relaxation region ERR has a function of relaxing the electric field convergence at the corner portion of the mesa structure MS and improving the withstand voltage.

In addition, as shown in FIG. 15, a resistance reduction region RR that is a p-type semiconductor region is formed on the surface of a mesa structure MS using, for example, an ion implantation method. This resistance reduction region RR lies adjacent to the electric charge implantation region EIR, and the impurity concentration of the resistance reduction region RR is set higher than that of the electric charge implantation region EIR. To put it concretely, the impurity concentration of the resistance reduction region RR is, for example, $1\times10^{18}/cm^3$ or larger and smaller than $1\times10^{22}/cm^3$.

Furthermore, as shown in FIG. 15, a leakage reduction region LR that is a p-type semiconductor region is formed at the sidewall portion of the mesa structure MS using, for example, an ion implantation method. The impurity concentration of this leakage reduction region LR is larger than the impurity concentration of the electric field relaxation region ERR, and smaller than impurity concentration of the resistance reduction region RR. To put it concretely, the impurity concentration of the leakage reduction region LR is, for example, $1\times10^{16}/cm^3$ or larger and smaller than $5\times10^{20}/cm^3$. Here, in this first embodiment, the impurity concentration of the leakage reduction region LR, which is formed at the sidewall portion of the mesa structure MS, is set smaller than impurity concentration of the resistance reduction region RR. Therefore the number of implanted ions becomes small, with the result that the misalignment of atom arrangement at the sidewall portion of the mesa structure MS can be suppressed. In other words, according to this embodiment, the generation of "BPDs", which is caused by the misalignment of the atom arrangement, at the sidewall portion of the mesa structure MS can be suppressed.

Subsequently, in order to activate the conductivity type impurities implanted by the ion implantation methods, activation annealing (heat treatment) is performed. Next, with the use of, for example, a CVD (chemical vapor deposition) method, an insulating film IF that covers the mesa structure MS is formed as shown in FIG. 7. This insulating film IF can be formed of, for example, silicon oxide. Successively, with the use of a photolithography technology and an etching technology, an opening, which penetrates the insulating film IF and exposes the resistance reduction region RR, is formed. Subsequently, a cathode electrode CE, which is made of, for example, a metal film, is formed so as to make contact with the resistance reduction region RR exposed through the opening. In addition, an anode electrode AE, which is made of, for example, a metal film, is formed on the rear surface of a silicon carbide substrate 1S.

In the above-described way, the SiC-pn junction diode according to this first embodiment can be manufactured. Furthermore, in the SiC-pn junction diode according to this first embodiment, the generation of "BPDs" at the sidewall portion of the mesa structure MS is suppressed. This ensures that, even if a forward current is kept flowing through the SiC-pn junction diode according to this first embodiment, "BPDs", which are grown by binding energies of electrons and holes, are prevented from reaching the electric charge implantation region EIR. Accordingly, in the SiC-pn junction diode according to this first embodiment, the degradation of the conductive characteristic (the increase of the forward voltage) owing to the increase of the on-resistance can be suppressed. Therefore, in the SiC-pn junction diode according to this first embodiment, both improvement of the reliability and improvement of the property can be satisfied at the same time.

First Variation

Figure 16:
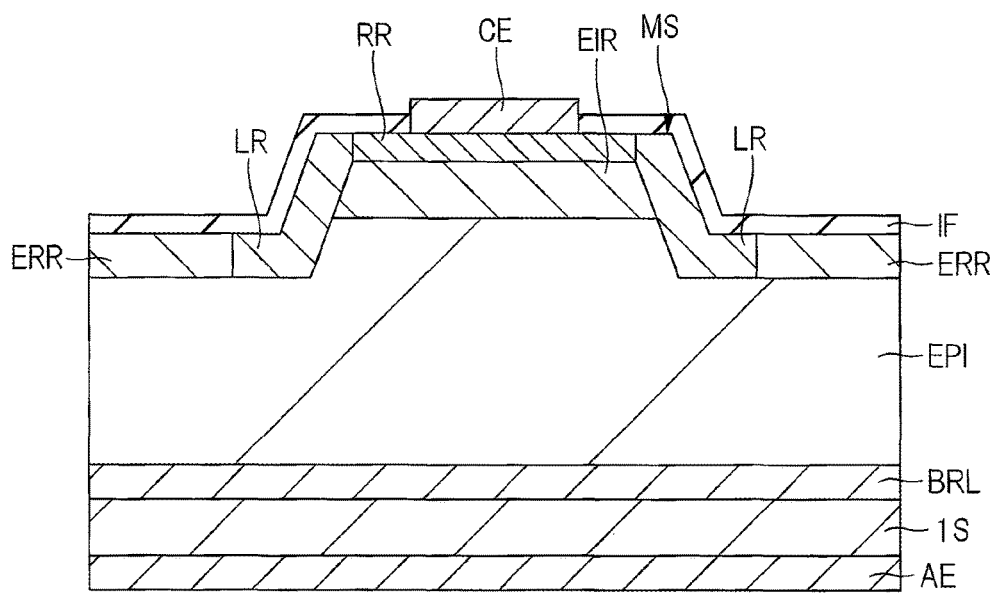
FIG. 16 is a cross-sectional view showing the device structure of an SiC-pn junction diode according to a first variation.

Next, a first variation according to the first embodiment will be explained. FIG. 16 is a cross-sectional view showing the device structure of an SiC-pn junction diode according to this first variation. The SiC-pn junction diode according to this first variation shown in FIG. 16 is different from the SiC-pn junction diode according to the first embodiment shown, for example, in FIG. 7, in that a BPD reduction region is formed between a silicon carbide substrate 1S and a drift layer EPI in the SiC-pn junction diode according to this first variation.

This BPD reduction layer BRL can be formed using, for example, an epitaxial growth method. The thickness of the BPD reduction layer BRL is, for example, 0.5 μm or larger and smaller than 50 μm, and the impurity concentration of the BPD reduction layer BRL is, for example, $1\times10^{15}/cm^3$ or larger and smaller than $1\times10^{20}/cm^3$.

In the SiC-pn junction diode, which is fabricated in such a way, according to this first variation, the generation of "BPDs" that reach the insides of the drift layer EPI and an electric charge implantation region EIR can be suppressed.

Hereinafter, descriptions will be made in this regard. The silicon carbide substrate 1S is formed by, for example, a sublimation method, however it is well known that many "BPDs" are formed inside the silicon carbide substrate 1S formed using the sublimation method. These "BPDs" are two-dimensional area defects, and they are causes that bring about the increase of the on-resistance (the increase of the forward voltage) of the SiC-pn junction diode. Successively, if a forward current flows through a region where "BPDs" are formed, the growth of "BPDs" is accelerated by binding energies emitted by the recombinations of holes and electrons. In particular, if "BPDs" reach the drift layer EPI and the electric charge implantation region EIR, the lifetimes of holes become short, and therefore the forward current decreases.

To look more closely on this point, although many "BPDs" are formed inside the silicon carbide substrate, since the drift layer EPI, which is formed on the silicon carbide substrate 1S, is formed using an epitaxial growth method (CVD method), "BPDs" formed inside the silicon carbide substrate 1S transforms themselves into "TEDs (threading edge dislocations)" inside the drift layer EPI. Since these "TEDs" are one-dimensional line defects, and not area defects, these "TEDs" do not bring about the increase of the on-resistance.

However, "BPDs" are also formed inside the drift layer EPI itself. In this case, holes flow from the electric charge implantation region EIR into the drift layer EPI, and electrons in the drift layer EPI and the holes that flow into the drift layer EPI bind together, with the result that there arises concern that the "BPDs" that exist in the drift layer EPI are grown by binding energies emitted by the combinations of the holes and the electrons, and the "BPDs" reach the electric charge implantation region EIR. In other words, when the "BPDs" reach the electric charge implantation region EIR, the increase of the on-resistance (the increase of the forward voltage) is induced.

Therefore, as shown in FIG. 16, the BPD reduction layer BRL is formed between the silicon carbide substrate 1S and the drift layer EPI. In this case, it is considered that although most of "BPDs" formed inside the silicon carbide substrate 1S transform themselves into "TEDs" inside the BPD reduction layer BRL, "BPDs" exist even inside the BPD reduction layer BRL itself.

However, in this first variation, the impurity concentration of the BPD reduction layer (n-type semiconductor) BRL is set larger than the impurity concentration of the drift layer EPI. For this reason, holes implanted into the inside of the drift layer EPI are not implanted into the BPD reduction layer BRL having the larger impurity concentration. In other words, since the impurity concentration of the BPD reduction layer BRL is high, holes are not implanted into the inside of the BPD reduction layer BRL. The above means that, even if "BPDs" exist inside the BPD reduction layer BRL, holes are not implanted into the inside of the BPD reduction layer BRL, so that the combinations of holes and electrons inside the BPD reduction layer BRL are suppressed. Therefore, even if "BPDs" exist inside the BPD reduction layer BRL, it is suppressed that the binding energies emitted by the combinations of holes and electrons are supplied to the "BPDs", so that the growth of the "BPDs" formed inside the BPD reduction layer BRL is suppressed. With this, even if "BPDs" exist inside the BPD reduction layer BRL, it can be suppressed that these "BPDs" grow into the drift layer EPI into which holes are implanted and the electric charge implantation region EIR which is the supply source of holes. As a result, according to this first variation, the increase of the on-resistance (the increase of the forward voltage) caused by "BPDs" can be suppressed.

Second Variation

Figure 17:
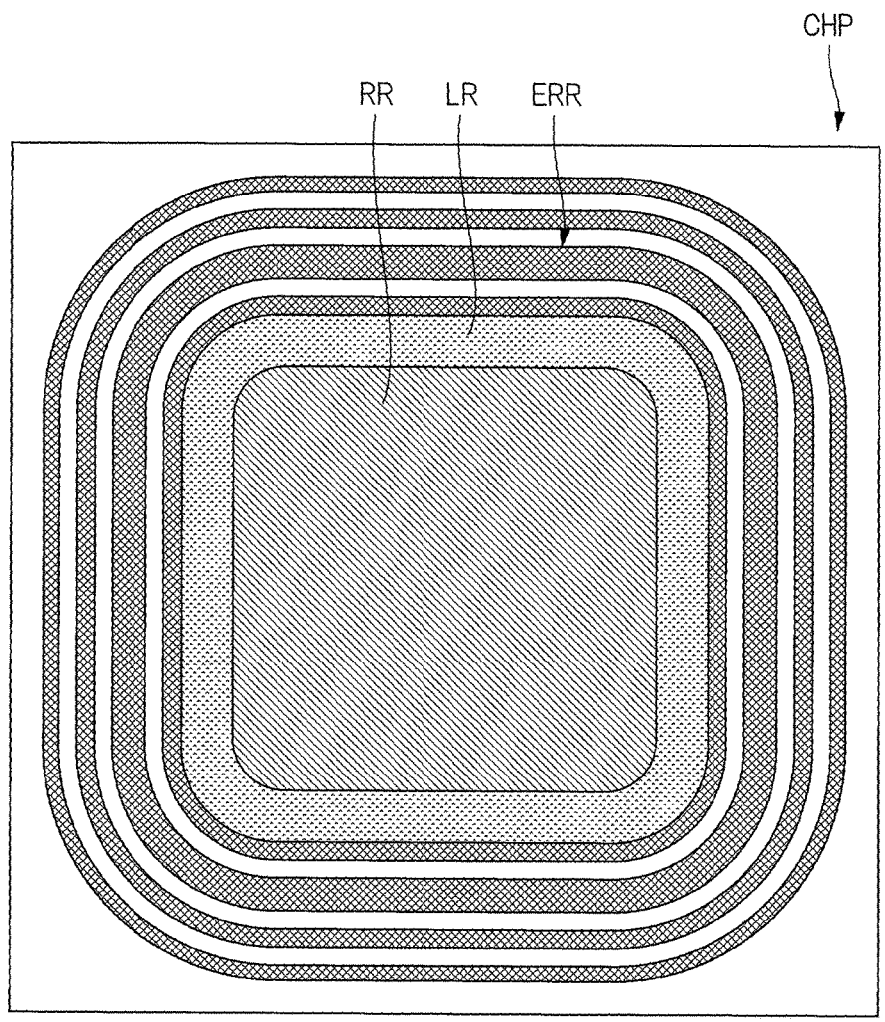
FIG. 17 is a plan view showing the device structure of an SiC-pn junction diode according to a second variation.

Next, a second variation according to this first embodiment will be explained. FIG. 17 is a plan view showing the device structure of an SiC-pn junction diode according to this second variation, and FIG. 18 is a cross-sectional view showing a part of the device structure of the SiC-pn junction diode according to this second variation.

Figure 18:
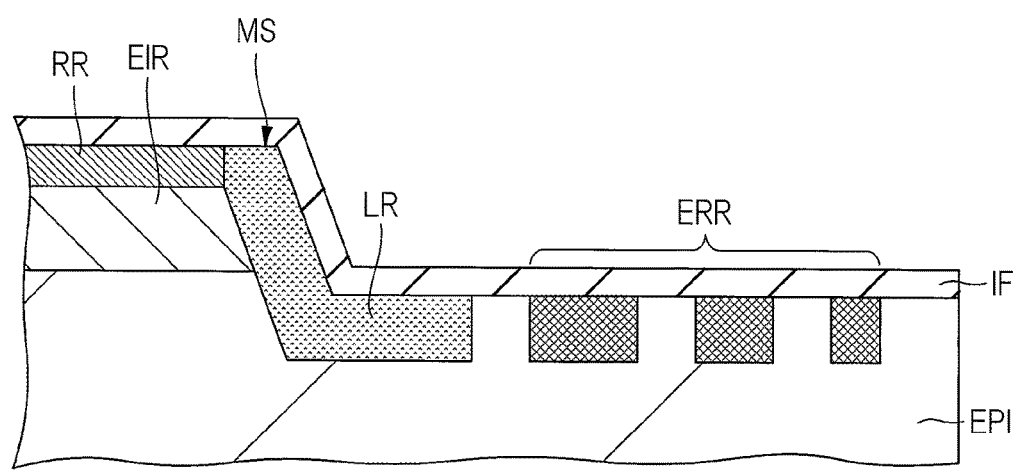
FIG. 18 is a cross-sectional view showing a part of the device structure of the SiC-pn junction diode according to the second variation.

The SiC-pn junction diode according to this second variation shown in FIG. 17 and FIG. 18 is different from the SiC-pn junction diode according to the first embodiment shown, for example, in FIG. 7, in that an electric field relaxation ERR is formed by plural ring-shaped regions (circular regions) in the SiC-pn junction diode according to this second variation.

For example, if the change of an impurity concentration (the spatial derivative of an impurity concentration) is gradual, electric field convergence is not easily generated, therefore the change of the impurity concentration of the electric field relaxation region ERR is set gradual as the fundamental idea of this second variation. To put it concretely, in this second variation, the impurity concentration at a point of the electric field relaxation region ERR becomes smaller as the point is farther apart from a leakage reduction region LR. In particular, in this second variation, the widths of the plural ring-shaped regions are different from each other in a direction from the leakage reduction region LR to the electric field relaxation region ERR (a first direction). To put it in detail, as shown in FIG. 18, the width of each ring-shaped region becomes smaller as each ring-shaped region is farther apart from a mesa structure MS in the direction from the leakage reduction region LR to the electric field relaxation region ERR (the first direction). With this, the structure of the SiC-pn junction diode according to the second variation, in which the impurity concentration at a point of the electric field relaxation region ERR becomes smaller as the point is farther apart from the leakage reduction region LR, is brought into shape. This is because, if the impurity concentrations of the plural ring-shaped regions are uniform, the fact that the ratio of each ring-shaped region per predefined pitch in the first direction becomes smaller as each ring-shaped region is farther apart from the leakage reduction region LR means that the average impurity concentration of each ring-shaped region per predefined pitch becomes smaller as each ring-shaped region is farther apart from the leakage reduction region LR.

The electric field relaxation region ERR according to this second variation fabricated in such a way has an advantage that the plural ring-shaped regions of the electric field relaxation region ERR can be formed by one photolithography process and one ion implantation technology because the impurity concentrations of the plural ring-shaped regions are equal to each other.

Third Variation

Figure 19:
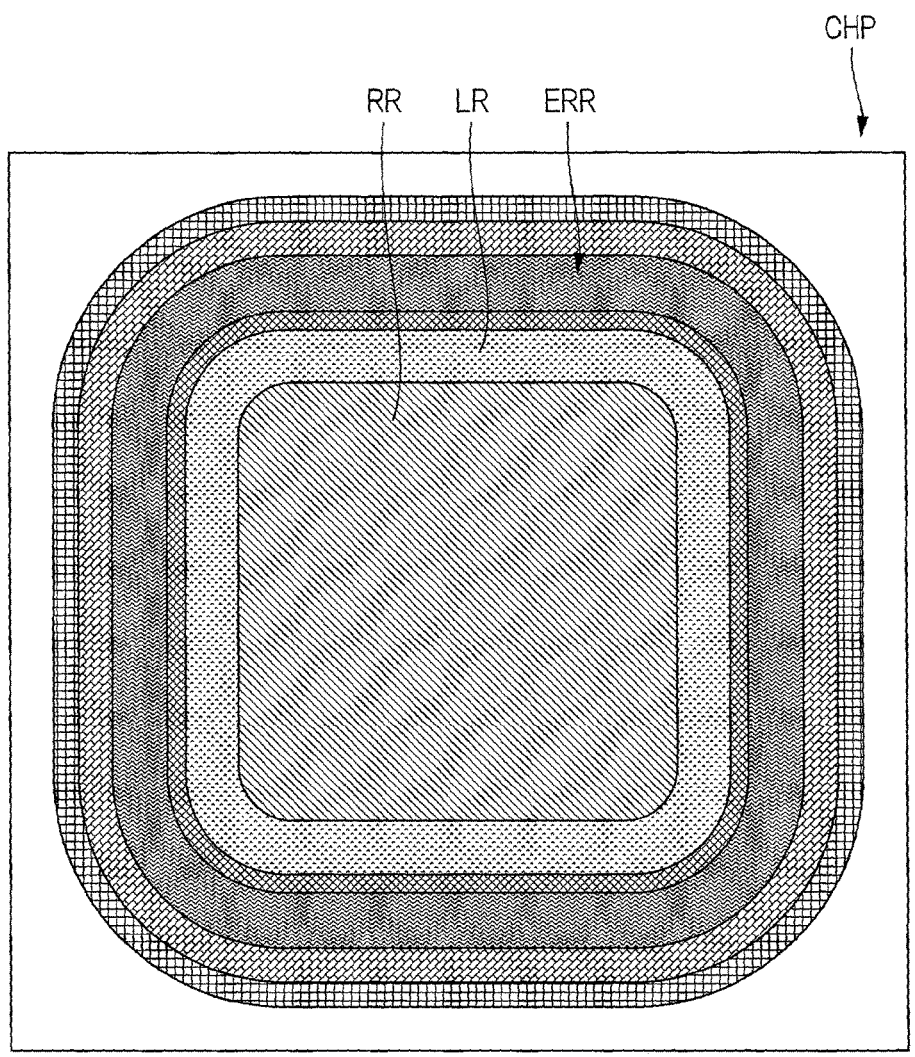
FIG. 19 is a plan view showing the device structure of an SiC-pn junction diode according to a third variation.

Next, a third variation according to the first embodiment will be explained. FIG. 19 is a plan view showing the device structure of an SiC-pn junction diode according to this third variation, and FIG. 20 is a cross-sectional view showing a part of the device structure of the SiC-pn junction diode according to this third variation.

Figure 20:
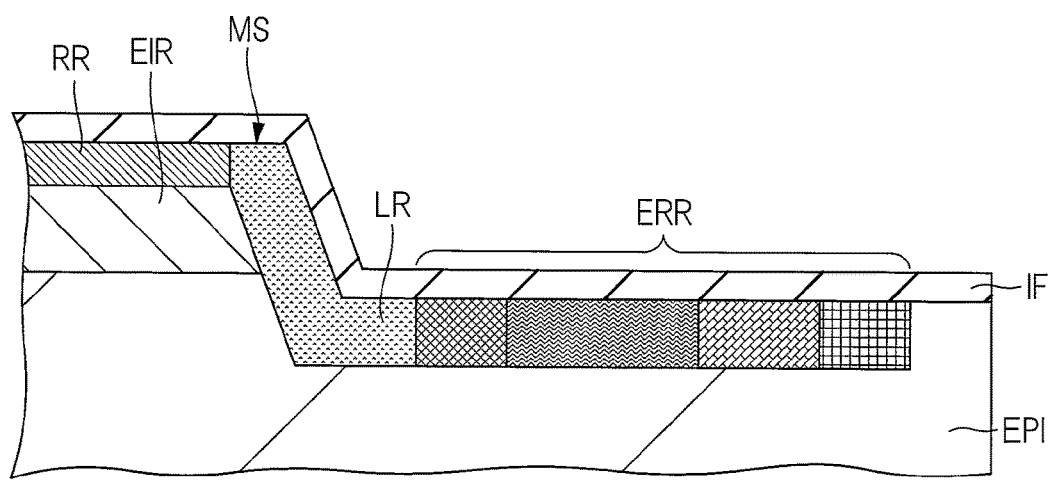
FIG. 20 is a cross-sectional view showing a part of the device structure of the SiC-pn junction diode according to the third variation.

The SiC-pn junction diode according to this third variation shown in FIG. 19 and FIG. 20 is different from the SiC-pn junction diode according to the first embodiment shown, for example, in FIG. 7, in that the impurity concentration at a point of an electric field relaxation ERR becomes continuously smaller in accordance with the distance between the point and a mesa structure MS. In this third variation fabricated in such a way, as is the case with the second variation, since the change of the impurity concentration of the electric field relaxation region ERR can be set gradual, an advantageous effect that electric field convergence can be suppressed can be obtained. In particular, in the case of this third variation, an advantage that, since the impurity concentration of the electric field relaxation region ERR is continuously changed unlike in the case of the second variation, electric field convergence can be suppressed more effectively than in the case of the second variation can be obtained.

Second Embodiment

Device Structure of Gate Turnoff Thyristor

Although, in the above-described first embodiment, an example in which a technological idea is applied to an SiC-pn junction diode has been described, an example in which a technological idea is applied to a gate turnoff thyristor (referred to as an SiC-GTO hereinafter) will be described in a second embodiment.

Briefly speaking, an SiC-GTO is a thyristor that can be transferred from its conductive state to its nonconductive state (its turnoff state) by adjusting the extension of a depletion layer through the control of a gate voltage applied to the gate electrode of the SiC-GTO. In other words, it can be said that the SiC-GTO is a thyristor which is turned off by a gate voltage applied to its gate electrode.

Figure 21:
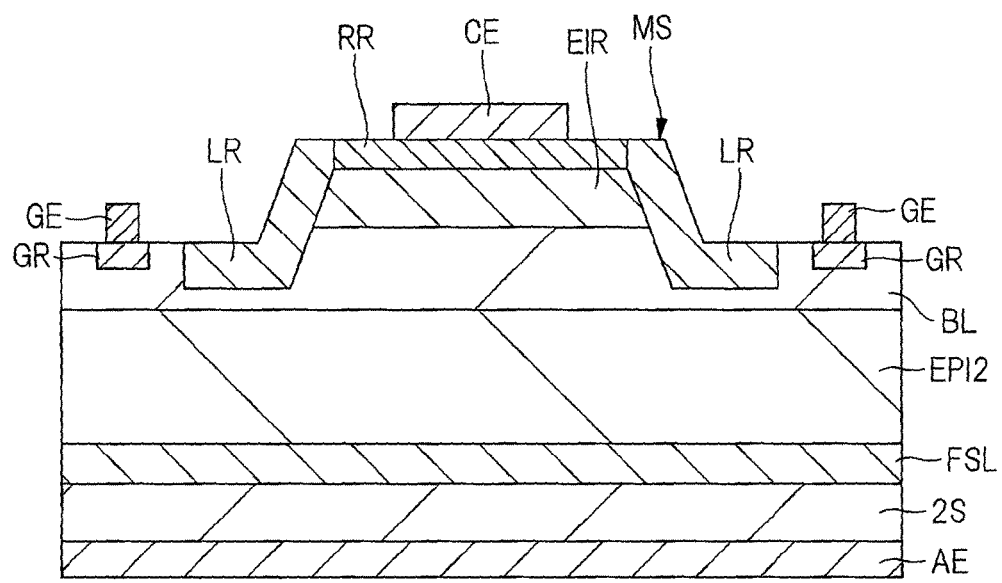
FIG. 21 is a cross-sectional view showing the device structure of an SiC-GTO according to a second embodiment.

FIG. 21 is a cross-sectional view showing the device structure of the SiC-GTO according to this second embodiment. As shown in FIG. 21, the SiC-GTO according to this embodiment includes: a silicon carbide substrate 2S into which n-type impurities are implanted; a field stop layer FSL that is made of a p-type semiconductor layer and is formed on the silicon carbide substrate 2S; a drift layer EPI2 that is made of a p-type semiconductor layer and formed on the field stop layer FSL; and a base layer BL that is made of an n-type semiconductor layer and is formed on the drift layer EPI2. In addition, a mesa structure MS is formed on the surface of the base layer BL, and a gate region GR is formed on the surface of a part of the base layer BL on the outside of this mesa structure MS. Furthermore, as shown in FIG. 21, an electric charge implantation region EIR that is made of a p-type semiconductor region and formed on the base layer BL, and a resistance reduction region RR that is made of a p-type semiconductor region and formed on the electric charge implantation region EIR are formed in the mesa structure MS. In addition, a leakage reduction region LR, which is formed at the sidewall portion of the mesa structure MS, made of a p-type semiconductor region, and lies adjacent to the resistance reduction region RR, the electric charge implantation region EIR and the base layer BL, is formed in the mesa structure MS.

Furthermore, as shown in FIG. 21, a cathode electrode CE, which is made of, for example, a metal film is formed so as to directly lie adjacent to the resistance reduction region RR, and a gate electrode GE, which is made of, for example, a metal film is formed so as to directly lie adjacent to the gate region GR. On the other hand, an anode electrode AE, which is made of, for example, a metal film, is formed on the rear surface of the silicon carbide substrate 2S.

The silicon carbide 2S is formed using, for example, a sublimation method. The thickness of this silicon carbide substrate 2S is 100 μm or larger and smaller than 1000 μm, and the silicon carbide substrate 2S is made of single crystals of silicon carbide into which n-type impurities such as nitrogen (N) and phosphorus (P) are implanted.

The field stop layer FSL is formed using, for example, an epitaxial growth method, and p-type impurities such as aluminum (Al) and Boron (B) are implanted into the field stop layer FSL. The impurity concentration of this field stop layer FSL is, for example, $1 \times 10^{15}/cm^3$ or larger and smaller than $1 \times 10^{19}/cm^3$.

The drift layer EPI2 is formed using, for example, an epitaxial growth method, and p-type impurities such as aluminum (Al) and boron (B) are implanted into the drift layer EPI2. The impurity concentration of this drift layer EPI2 is, for example, $1 \times 10^{12}/cm^3$ or larger and smaller than $1 \times 10^{18}/cm^3$.

The base layer BL is formed using, for example, an epitaxial growth method, and n-type impurities such as nitrogen (N) and phosphorus (P) are implanted into the base layer BL. The impurity concentration of this base layer BL is, for example, $1 \times 10^{15}/cm^3$ or larger and smaller than $1 \times 10^{19}/cm^3$.

The electric charge implantation region EIR is formed using, for example, an epitaxial growth method, and p-type impurities such as aluminum (Al) and boron (B) are implanted into the electric charge implantation region EIR. The thickness of this electric charge implantation region EIR is, for example, 0.5 μm or larger and smaller than 30 μm, and the impurity concentration of the electric charge implantation region EIR is, for example, $1 \times 10^{17}/cm^3$ or larger and smaller than $1 \times 10^{21}/cm^3$.

The resistance reduction region RR is formed using, for example, an ion implantation method, and p-type impurities such as aluminum (Al) and boron (B) are implanted into the resistance reduction region RR. The impurity concentration of this resistance reduction region RR is, for example, $1 \times 10^{18}/cm^3$ or larger and smaller than $1 \times 10^{22}/cm^3$.

The leakage reduction region LR is formed using, for example, an ion implantation method, and p-type impurities such as aluminum (Al) and boron (B) are implanted into the leakage reduction region LR. The impurity concentration of this leakage reduction region LR is, for example, $1 \times 10^{16}/cm^3$ or larger and smaller than $5 \times 10^{20}/cm^3$.

The gate region GR is formed using, for example, an ion implantation method, and n-type impurities such as nitrogen (N) and phosphorus (P) are implanted into the gate region GR.

The SiC-GTO according to this second embodiment is fabricated in the above-described way. As is the case with the first embodiment, the feature of this second embodiment lies in the fact that the impurity concentration of the leakage reduction region LR is smaller than the impurity concentration of the resistance reduction region RR. With this, the increase of the on-resistance of the SiC-GTO caused by the occurrence of "BPDs" can be suppressed in the case of the SiC-GTO according to this second embodiment as well. Therefore, the degradation of the conductive characteristic of the SiC-GTO according to this second embodiment can also be suppressed, and therefore the improvement of the property of the SiC-GTO can be achieved.

As above, the invention made by the present inventors has been concretely described on the basis of the embodiments of the present invention, but the present invention is not limited to the above embodiments, and it goes without saying that various modifications can be made without departing from the spirit and scope of the present invention.

The above-described embodiments include the following embodiment.

Additional Statement

A semiconductor device comprising:

a silicon carbide substrate;

a second conductivity type field stop layer formed on the silicon carbide substrate;

a second conductivity type drift layer formed on the field stop layer;

a first conductivity type base layer conductivity type of which is opposite to the second conductivity type and that is formed on the drift layer;

a mesa structure formed on the surface of the base layer; and a gate region formed on the outside of the mesa structure, wherein in the mesa structure, there are formed:

an electric charge implantation region of the second conductivity type formed on the base layer;

a resistance reduction region of the second conductivity type formed on the electric charge implantation region;

a leakage reduction region of the second conductivity type that is formed at a sidewall portion of the mesa structure and adjacent to the resistance reduction region, the electric charge implantation region, and the base layer, wherein the impurity concentration of the leakage reduction region is smaller than the impurity concentration of the resistance reduction region.

LIST OF REFERENCE SIGNS

1S: Silicon Carbide Substrate
BRL: BPD Reduction Layer
EIR: Electric Charge Implantation Region
EPI: Drift Layer
ERR: Electric Field Relaxation Region
IF: Insulation Film
LR: Leakage Reduction Region
MS: Mesa Structure
RR: Resistance Reduction Region

The invention claimed is:

1. A semiconductor device comprising:
a silicon carbide substrate;
a first conductivity type drift layer formed on the silicon carbide substrate;
a mesa structure formed on a surface of the drift layer; and
a second conductivity type electric field relaxation region the conductivity type of which is opposite to the first conductivity type and that is formed in an outer edge region outside the mesa structure on a surface region of the drift layer,
wherein in the mesa structure, there are formed:
an electric charge implantation region of the second conductivity type formed on the drift layer;
a resistance reduction region of the second conductivity type formed on the electric charge implantation region;
a leakage reduction region of the second conductivity type that is formed at a sidewall portion of the mesa structure and adjacent to the resistance reduction region, the electric charge implantation region, and the electric field relaxation region, and
an insulating film adjacent to the leakage reduction region;
wherein the leakage reduction region extends from the sidewall portion over a corner portion between the sidewall portion and the insulating film to the electric field relaxation region,
wherein the impurity concentration of the electric charge implantation region is larger than the impurity concentration of the electric field relaxation region and smaller than the impurity concentration of the resistance reduction region, and
wherein the impurity concentration of the leakage reduction region is larger than the impurity concentration of the electric field relaxation region and smaller than the impurity concentration of the resistance reduction region.

2. The semiconductor device according to claim 1, wherein the impurity concentration of the electric field relaxation region becomes smaller as farther apart from the leakage reduction region.

3. The semiconductor device according to claim 1, wherein the electric field relaxation region is formed of a plurality of circular regions.

4. The semiconductor device according to claim 3, wherein in a first direction from the leakage reduction region to the electric field relaxation region, the widths of the plurality of circular regions decrease in relation to each other.

5. The semiconductor device according to claim 1, wherein the semiconductor device includes a first conductivity type BPD reduction layer between the silicon carbide substrate and the drift layer when cross-sectionally viewed, and
the impurity concentration of the BPD reduction layer is larger than the impurity concentration of the drift layer.

6. The semiconductor device according to claim 1, wherein the semiconductor device is a diode.

7. The semiconductor device according to claim 6, wherein the semiconductor device is a free wheel diode that is a component included in an electric power conversion device.

8. An electric power conversion device comprising the semiconductor device according to claim 1.

9. A manufacturing method of the semiconductor device according to claim 1, comprising:
a step (a) of preparing the silicon carbide substrate on which the first conductivity type drift layer and a semiconductor layer of the second conductivity type are formed;
a step (b) of forming the mesa structure, which includes the electric charge implantation region formed by processing the semiconductor layer and a part of the drift layer adjacent to the electric charge implantation region, on the silicon carbide substrate by etching a part of the semiconductor layer and a part of the drift layer;
a step (c) of forming the second conductivity type resistance reduction region adjacent to the electric charge implantation region in an upper part of the mesa structure after the step (b);
a step (d) of forming the second conductivity type leakage reduction region adjacent to the electric charge implantation region at the sidewall portion of the mesa structure after the step (b);
a step (e) of forming the second conductivity type electric field relaxation region in the outer edge region outside the mesa structure on a surface region of the drift layer after the step (b), and
a step (f) of forming the insulating film,
wherein the leakage reduction region extends from the sidewall portion over a corner portion between the sidewall portion and the insulating film to the electric field relaxation region,
wherein the impurity concentration of the electric charge implantation region is larger than the impurity concentration of the electric field relaxation region and smaller than the impurity concentration of the resistance reduction region, and
wherein the impurity concentration of the leakage reduction region is larger than the impurity concentration of the electric field relaxation region, and smaller than the impurity concentration of the resistance reduction region.

10. The manufacturing method of a semiconductor device according to claim 9,
wherein an ion implantation method is used in each of the step (c), the step (d), and the step (e).

* * * * *